(12) United States Patent
Hirata

(10) Patent No.: US 11,227,822 B2
(45) Date of Patent: Jan. 18, 2022

(54) SEMICONDUCTOR DEVICE

(71) Applicant: ROHM CO., LTD., Kyoto (JP)

(72) Inventor: Shigeru Hirata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/046,858

(22) PCT Filed: Apr. 12, 2019

(86) PCT No.: PCT/JP2019/015903
§ 371 (c)(1),
(2) Date: Oct. 12, 2020

(87) PCT Pub. No.: WO2019/203139
PCT Pub. Date: Oct. 24, 2019

(65) Prior Publication Data
US 2021/0151366 A1   May 20, 2021

(30) Foreign Application Priority Data

Apr. 19, 2018 (JP) .............................. JP2018-080398

(51) Int. Cl.
*H01L 23/495* (2006.01)
*H01L 23/31* (2006.01)
*H02P 27/08* (2006.01)

(52) U.S. Cl.
CPC .... *H01L 23/49575* (2013.01); *H01L 23/3107* (2013.01); *H01L 23/4952* (2013.01);
(Continued)

(58) Field of Classification Search
CPC ........... H01L 23/49575; H01L 23/3107; H01L 23/49513; H01L 23/4952; H01L 23/49562
See application file for complete search history.

(56) References Cited

U.S. PATENT DOCUMENTS

| 5,869,884 A | 2/1999 | Kimoto |
| 2011/0156229 A1* | 6/2011 | Shinohara ............... H01L 24/49 257/676 |

(Continued)

FOREIGN PATENT DOCUMENTS

| JP | 4-8446 U | 1/1992 |
| JP | 10-12796 A | 1/1998 |

(Continued)

OTHER PUBLICATIONS

International Search Report issued in PCT/JP2019/015903, dated Jun. 11, 2019 (2 pages).

*Primary Examiner* — Marc Anthony Armand
(74) *Attorney, Agent, or Firm* — Hamre, Schumann, Mueller & Larson, P.C.

(57) ABSTRACT

A semiconductor device includes a first lead having a base extending in a first direction, and an IC on the base. The semiconductor device also includes a second lead, a third lead and fourth leads. The second lead includes a first belt-like section on one side of the base in the first direction, extending in a second direction, and paired second belt-like sections extending in the first direction from the first belt-like section. The third lead is on one side in the first direction. The fourth leads are on one side of the third lead in the first direction. First switching elements are bonded to the third lead. Second switching elements are respectively bonded to the fourth leads. The base overlaps with the first belt-like section 121 when viewed in the first direction. At least a part of the base is between the second belt-like sections.

17 Claims, 16 Drawing Sheets

(52) U.S. Cl.
CPC .. *H01L 23/49513* (2013.01); *H01L 23/49562* (2013.01); *H02P 27/08* (2013.01)

(56) References Cited

U.S. PATENT DOCUMENTS

| | | |
|---|---|---|
| 2012/0146205 A1 | 6/2012 | Fernando et al. |
| 2014/0284784 A1 | 9/2014 | Yasunaga et al. |
| 2015/0042373 A1 | 2/2015 | Nakamura |
| 2018/0182719 A1* | 6/2018 | Muto ................ H01L 24/48 |

FOREIGN PATENT DOCUMENTS

| | | |
|---|---|---|
| JP | 2012-129489 A | 7/2012 |
| JP | 2014-207430 A | 10/2014 |
| JP | 2015-35515 A | 2/2015 |
| JP | 2017-34079 A | 2/2017 |

* cited by examiner

SEMICONDUCTOR DEVICE

TECHNICAL FIELD

The present disclosure relates to a semiconductor device to be used to control, for example, an electric motor.

BACKGROUND ART

A semiconductor device for controlling the operation of a motor includes, for example, a plurality of switching elements (e.g., MOSFET), and an IC for driving the switching elements. Patent Document 1 discloses an example of such a semiconductor device (see FIG. 11). The disclosed semiconductor device is applicable to control of the operation of a brushless DC motor.

The semiconductor device of Document 1 includes six switching elements for converting DC power to three-phase AC power. The switching elements are aligned in one direction (x-direction in FIG. 11), and therefore the semiconductor device has to be formed in an elongate shape extending in that direction. This issue nay need to be addressed, from the viewpoint of reduction in the device size.

PRIOR ART DOCUMENT

Patent Document

Patent Document 1: JP-A-2017-34079

SUMMARY OF INVENTION

Problem to be Solved by the Invention

In view of the foregoing situation, an object of the present disclosure is to provide a semiconductor device that can be produced with a reduced size.

Means for Solving the Problem

In an aspect, the present disclosure provides a semiconductor device including a first lead having a mounting base elongate in a first direction, an IC configured to be mounted on the mounting base, a second lead including a first belt-like section spaced apart from the mounting base in the first direction, and a pair of second belt-like sections connected to the first belt-like section, the first belt-like section being elongate in a second direction orthogonal to both of the first direction and a thickness direction of the mounting base, a third lead configured to space apart from the first lead, with the second lead interposed therebetween, a plurality of first switching elements configured to electrically connect to the third lead, and configured to electrically connect to the IC, a plurality of fourth leads configured to space apart from the second lead, with the third lead interposed therebetween, and configured to electrically connect respectively to the plurality of first switching elements, a plurality of second switching elements configured to electrically connect respectively to the plurality of fourth leads, and each configured to electrically connect to both of the IC and the second lead, and a sealing resin arranged to cover a part of each of the plurality of fourth leads, the first lead, the second lead, and the third lead, and to cover the IC, the plurality of first switching elements, and the plurality of second switching elements. Further, the mounting base overlaps with the first belt-like section, when viewed in the first direction, and at least a part of the mounting base is located between the pair of second belt-like sections.

Preferably, the first lead may include a first terminal section, a first joint section, and a first suspension section, the first terminal section may protrude from the sealing resin in the first direction, when viewed in the thickness direction, the first joint section may be connected to the mounting base and the first terminal section, and the first suspension section may be located on an opposite side of the first joint section in the second direction, with respect to the mounting base, and may extend from the mounting base in the second direction.

Preferably, the first joint section and the first suspension section may be located on a farther side from the first belt-like section of the second lead, with respect to the pair of second belt-like sections.

Preferably, the first joint section may include a region inclined with respect to both of the first direction and the second direction.

Preferably, the second lead may include a second terminal section protruding from the sealing resin in the first direction, when viewed in the thickness direction, a second joint section connected to one of the pair of second belt-like sections and the second terminal section, and a second suspension section extending from the other of the pair of second belt-like sections, in the second direction.

Preferably, the second joint section may be located adjacent to the first joint section in the second direction, and the second suspension section may be located adjacent to the first suspension section in the first direction.

Preferably, the second terminal section may be located adjacent to the first terminal section in the second direction.

Preferably, the second joint section may include a region inclined with respect to both of the first direction and the second direction.

Preferably, the third lead may include a plurality of first pad sections to which the plurality of first switching elements are electrically connected respectively, a third terminal section protruding from the sealing resin in the first direction, when viewed in the thickness direction, and a third joint section connected to the plurality of first pad sections and the third terminal section.

Preferably, the plurality of first pad sections may include a first region located adjacent to the second suspension section in the first direction, a second region located adjacent to the first belt-like section in the first direction, and a third region located adjacent to the second joint section in the first direction. The third joint section may include an outer joint section connected to the first region and the third terminal section, a first inner joint section connected to the first region and the second region, and a second inner joint section connected to the second region and the third region. The first belt-like section may overlap with the second region, the first inner joint section, and the second inner joint section, when viewed in the first direction, and a part of each of the pair of second belt-like sections may be located between the first inner joint section and the second inner joint section.

Preferably, the third lead may include a third suspension section extending from the third region in the second direction.

Preferably, a part of the second region may protrude from both of the first inner joint section and the second inner joint section, in the first direction.

Preferably, the first inner joint section and the second inner joint section may each include a belt-like region extending from the second region in the second direction, and the belt-like region of the first inner joint section may be shorter than the belt-like region of the second inner joint section.

Preferably, the plurality of fourth leads may each include a second pad section to which one of the plurality of second switching elements is electrically connected, and a fourth terminal section connected to the second pad section and protruding from the sealing resin in the first direction, when viewed in the thickness direction, and the plurality of fourth terminal sections may be aligned in the second direction, in alignment with the third terminal section.

Preferably, a part of one of the plurality of second pad sections may overlap with the first region, and be located between the outer joint section and the first inner joint section, when viewed in the first direction.

Preferably, the sealing resin may include a pair of side faces spaced apart from each other in the second direction, the first suspension section and the second suspension section each having an end face exposed from one of the pair of side faces, and the third suspension section having an end face exposed from the other of the pair of side faces.

Preferably, the IC may have a belt-like shape elongate in the first direction, when viewed in the thickness direction.

Advantageous Effects of Invention

With the foregoing configuration according to the present disclosure, the semiconductor device can be formed in a reduced size.

Other features and advantages of the present disclosure will become more apparent, through the detailed description given hereunder with reference to the accompanying drawings.

MODE FOR CARRYING OUT THE INVENTION

Figure 1:
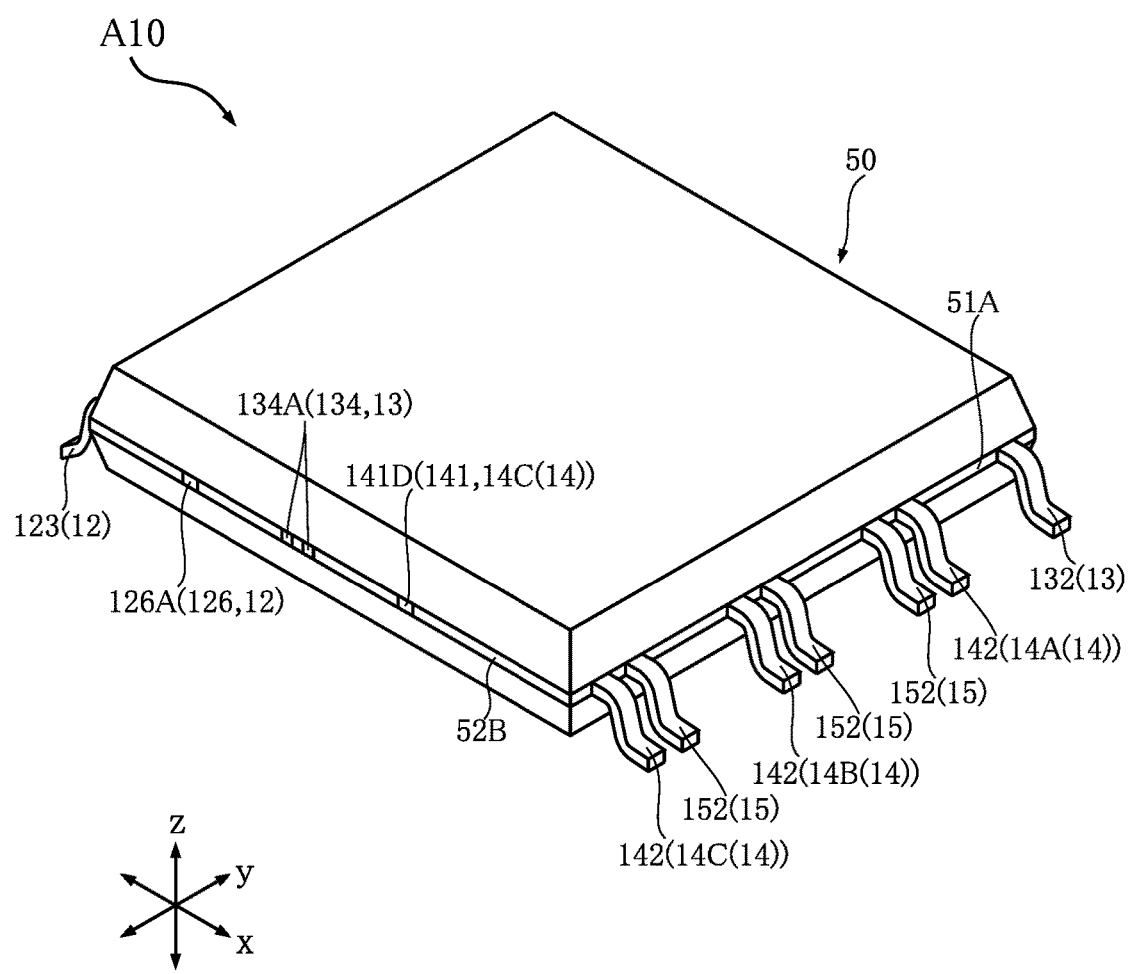
FIG. 1 is a perspective view showing a semiconductor device according to a first embodiment.

Hereafter, preferred embodiments of the present disclosure will be described, with reference to the drawings.

Referring to FIG. 1 to FIG. 15, a semiconductor device A10 according to a first embodiment will be described. The semiconductor device A10 includes a first lead 11, a second lead 12, a third lead 13, a plurality of fourth leads 14, a plurality of boot leads 15, a plurality of control leads 16, an integrated circuit or IC 20, a plurality of first switching elements 31, a plurality of second switching elements 32, and a sealing resin 50. The semiconductor device A10 also includes a plurality of first wires 41, a plurality of second wires 42, a plurality of first gate wires 431, a plurality of second gate wires 432, a plurality of first potential wires 441, a second potential wire 442, a plurality of boot wires 45, a ground wire 46, and a plurality of control wires 47. In FIG. 3, the mentioned elements are seen through the sealing resin 50, for the sake of clarity (see dash-dot-dot lines). FIG. 9 to FIG. 15 are cross-sectional views taken along dash-dot lines (IX-IX, X-X, and so forth) in FIG. 3.

In the description of the semiconductor device A10, three directions x, y, and z which are orthogonal to each other, marked in FIGS. 1 to 15, will be referred to as appropriate. In the present disclosure, the direction z will also be referred to as "thickness direction", which is orthogonal to, for example, a mounting base (to be subsequently described) of the first lead 11. The direction x and the direction y are orthogonal to the direction z, and will be referred to as "first direction" and "second direction", respectively. In subsequent passages, a semiconductor device A20 will also be described with reference to the three directions x, y, and z.

The semiconductor device A10 is configured to convert DC power to three-phase AC power, using the plurality of first switching elements 31 and the plurality of second switching elements 32. The semiconductor device A10 is applicable, for example, to control of the operation of a brushless DC motor.

The first lead 11, the second lead 12, the third lead 13, the plurality of fourth leads 14, the plurality of boot leads 15, and the plurality of control leads 16 are conductive materials constituted of the same lead frame. These conductive materials constitute a part of the conduction path between the functional elements (IC 20, plurality of first switching elements 31, and plurality of second switching elements 32), and a circuit board on which the semiconductor device A10 is mounted. The lead frame may be formed of copper (Cu) or a copper-based alloy.

The first lead 11 includes, as shown in FIG. 3, a mounting base 111, a first terminal section 112, a first joint section 113, and a first suspension section 114.

Figure 9:
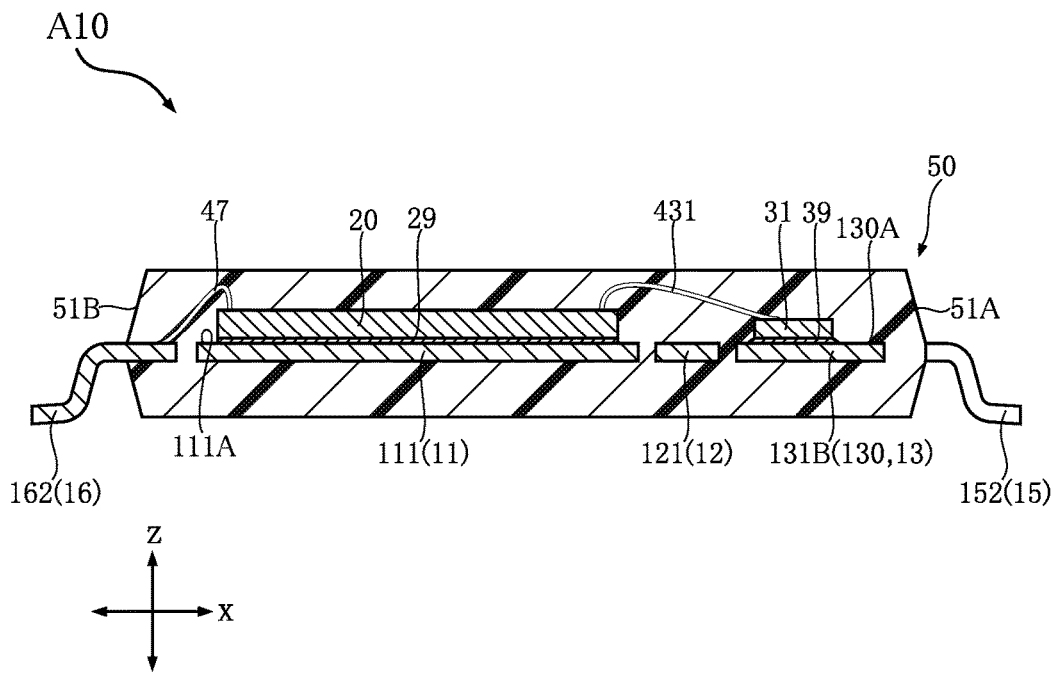
FIG. 9 is a cross-sectional view taken along a line IX-IX in FIG. 3.
Figure 10:
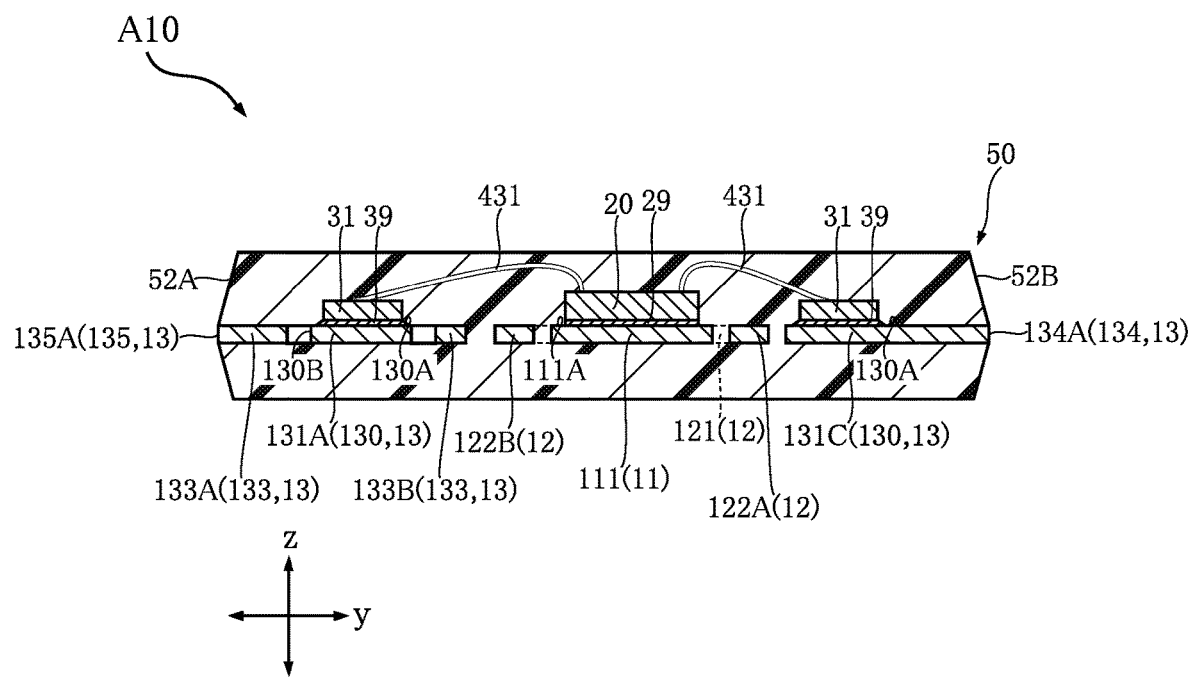
FIG. 10 is a cross-sectional view taken along a line X-X in FIG. 3.

As shown in FIG. 3, the mounting base 111 extends in the first direction x. The mounting base 111 has a rectangular shape having the long sides extending in the first direction x, when viewed in the thickness direction z. As shown in FIG. 9 and FIG. 10, the mounting base 111 includes a main face 111A oriented in the thickness direction z. In the illustrated example, the main face 111A is orthogonal to the thickness direction z. The main face 111A may be covered, for example, with a silver (Ag)-plated layer.

Figure 2:
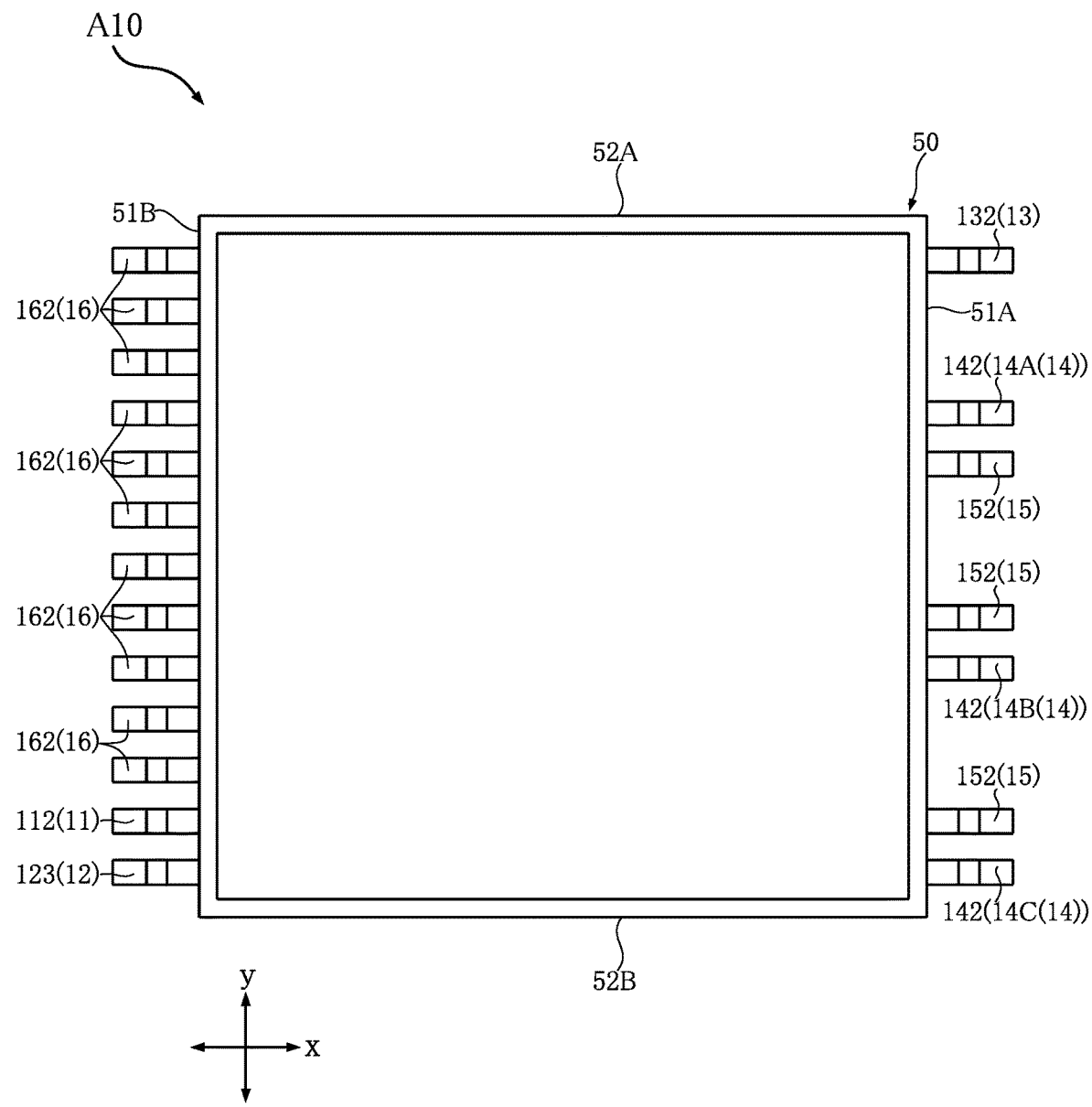
FIG. 2 is a plan view of the semiconductor device shown in FIG. 1.
Figure 3:
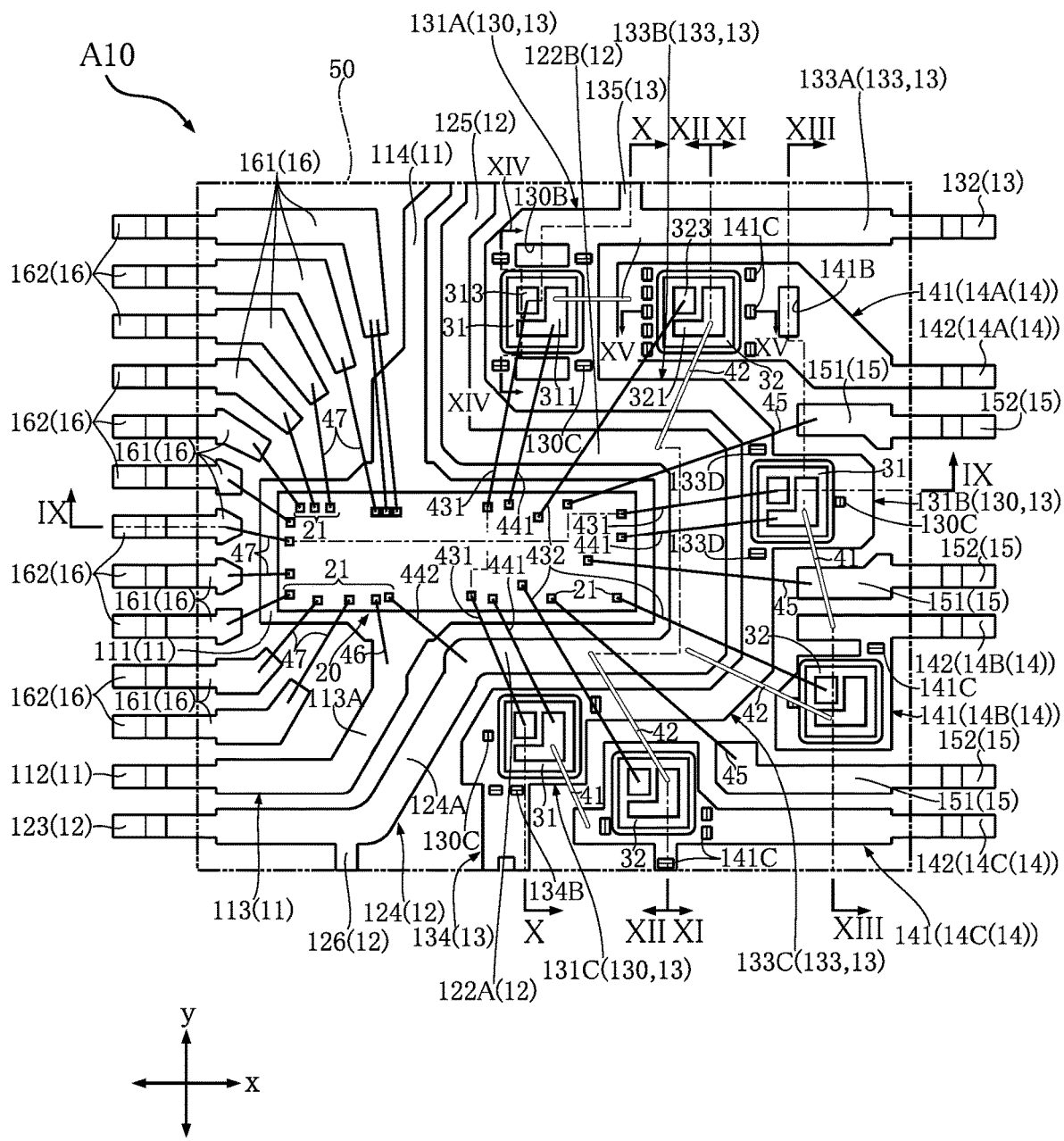
FIG. 3 is a plan view of the semiconductor device shown in FIG. 1, seen through a sealing resin.

As shown in FIG. 2 and FIG. 3, the first terminal section 112 protrudes from the sealing resin 50 in the first direction x (to the left in the drawings), when viewed in the thickness direction z. The first terminal section 112 is, for example, bent at two positions, when viewed in the second direction y (similar to a second terminal section 123 of the second lead 12 shown in FIG. 5). The first terminal section 112 may be covered, for example, with a tin (Sn)-plated layer, or a tin-silver alloy-plated layer.

As shown in FIG. 3, the first joint section 113 is connected to the mounting base 111 and the first terminal section 112. The first joint section 113 includes a region 113A inclined with respect to both of the first direction x and the second direction y. A surface of the first joint section 113 (oriented to the same side as is the main face 111A) may be covered, for example, with a silver-plated layer.

As shown in FIG. 3, the first suspension section 114 is located on the opposite side of the first joint section 113 in the second direction y, with respect to the mounting base 111. The first suspension section 114 extends in the second direction y. The mounting base 111 is interposed between the first joint section 113 and the first suspension section 114, in the second direction y. An end face 114A of the first suspension section 114 oriented in the second direction y is exposed from the sealing resin 50 (see FIG. 6). As shown in FIG. 3, the first suspension section 114 and the first joint section 113 are configured to space apart from the pair of second belt-like sections 122A and 122B (to be subsequently described) of the second lead 12 to the left, in other words in the direction away from the first belt-like section 121 of the second lead 12.

Figure 4:
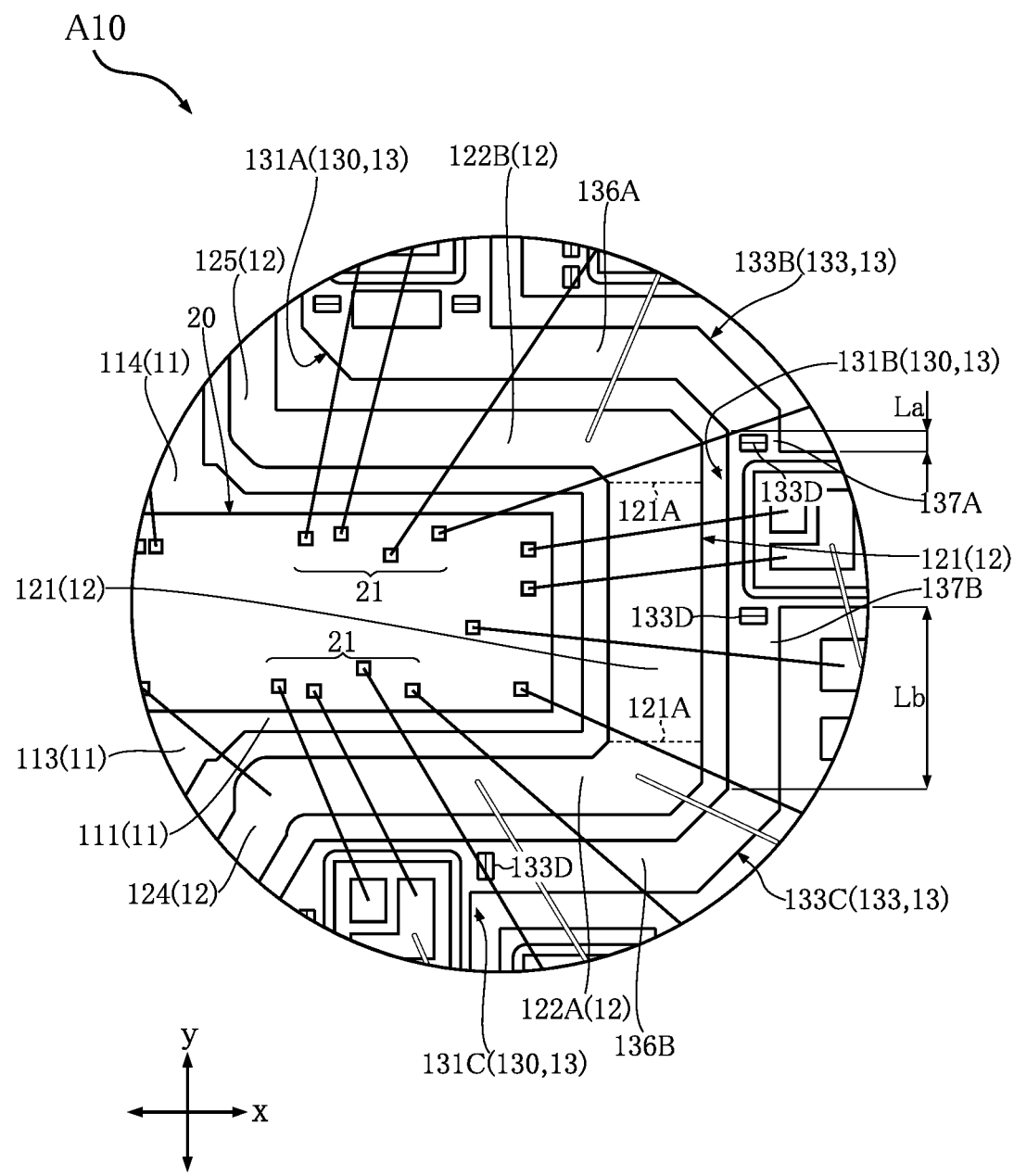
FIG. 4 is an enlarged plan view showing a part of FIG. 3.

The second lead 12 is formed so as to extend along an outer edge of the first lead 11, with a spacing therefrom, as shown in FIG. 3. In the illustrated example, the second lead 12 is located generally on the right of the first lead 11. As shown in FIG. 3 and FIG. 4, the second lead 12 includes a first belt-like section 121, a pair of second belt-like sections 122A and 122B, the second terminal section 123, a second joint section 124, a second suspension section 125, and a second auxiliary suspension section 126.

As shown in FIG. 4, the first belt-like section 121 is located on the right of the mounting base 111. The first belt-like section 121 extends in the second direction y. As shown in FIG. 10, the mounting base 111 overlaps with the first belt-like section 121, when viewed in the first direction x. Accordingly, the mounting base 111 and the first belt-like section 121 are at the same level in height, for example with respect to the bottom face of the sealing resin 50.

As shown in FIG. 4, the pair of second belt-like sections 122A and 122B extend to the left, from the respective ends 121A (configured to space apart from each other in the second direction y) of the first belt-like section 121. When viewed in the thickness direction z, the first belt-like section 121 and the pair of second belt-like sections 122A and 122B are orthogonal to each other. At least a part of the mounting base 111 is located between the pair of second belt-like sections 122A and 122B. The respective surfaces of the first belt-like section 121 and the pair of second belt-like sections 122A and 122B (surfaces seen in FIG. 4) may be covered, for example, with a silver-plated layer.

Figure 5:
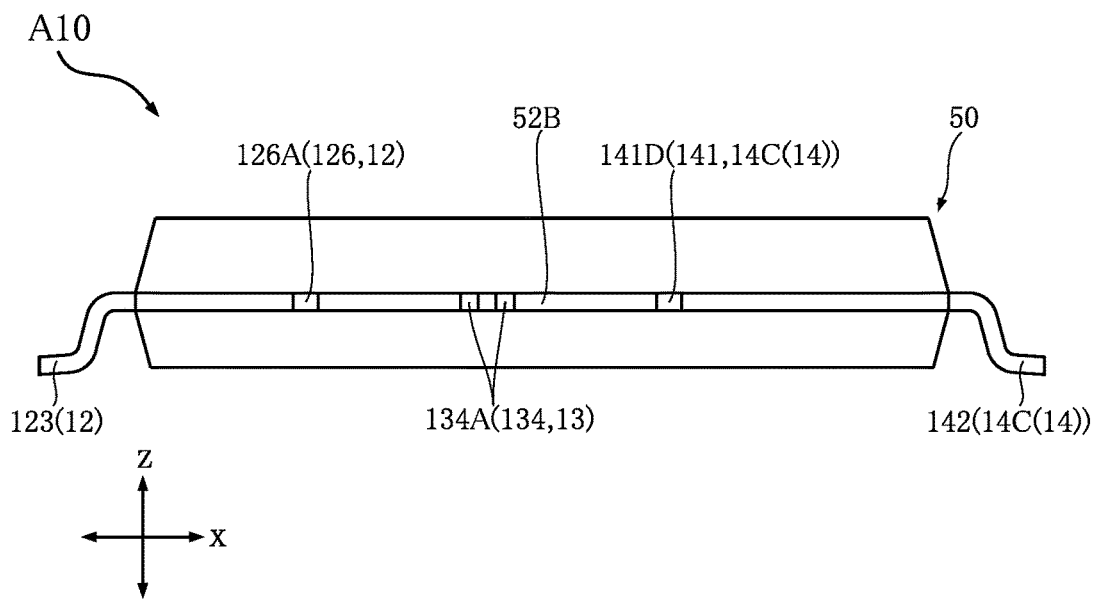
FIG. 5 is a front view of the semiconductor device shown in FIG. 1.

As shown in FIG. 2 and FIG. 3, the second terminal section 123 protrudes to the left from the sealing resin 50, when viewed in the thickness direction z. As shown in FIG. 5, the second terminal section 123 is bent, when viewed in the second direction y. More specifically, the second terminal section 123 is bent at a first point, distant from the side face of the sealing resin 50 by a predetermined distance, and extends obliquely downward. The second terminal section 123 is again bent at a second point, and then extends generally horizontally (direction x). The second terminal section 123 is located adjacent to the first terminal section 112, in the second direction y. The second terminal section 123 may be covered, for example, with a tin-plated layer, or a tin-silver alloy-plated layer.

As shown in FIG. 3, the second joint section 124 is connected to the second belt-like section 122A and the second terminal section 123. The second joint section 124 is located on the left of the pair of second belt-like sections 122A and 122B, in the first direction x. In the second direction y, the second joint section 124 is located adjacent to the first joint section 113. The second joint section 124 includes a region 124A, inclined with respect to both of the first direction x and the second direction y. The surface of the second joint section 124 (surface seen in FIG. 3) may be covered, for example, with a silver-plated layer.

As shown in FIG. 3, the second suspension section 125 extends from the second belt-like section 122B, in the second direction y. At least a part of the second suspension section 125 is located on the left of the pair of second belt-like sections 122A and 122B, in the first direction x. In addition, the second suspension section 125 is located adjacent to the first suspension section 114, in the first direction x. An end face 125A of the second suspension section 125 oriented in the second direction y is exposed from the sealing resin 50 (see FIG. 6).

As shown in FIG. 3, the second joint section 124 includes a portion extending in the first direction x, and a second auxiliary suspension section 126 extends from such portion, in the second direction y. An end face 126A of the second auxiliary suspension section 126 oriented in the second direction y is exposed from the sealing resin 50 (see FIG. 5).

The third lead 13 is located on the right of the second lead 12, as shown in FIG. 3. The third lead 13 includes a plurality of first pad sections 130, a third terminal section 132, a third joint section 133, a third suspension section 134, and a third auxiliary suspension section 135. In the example shown in FIG. 3, three first pad sections 130 are provided.

Figure 14:
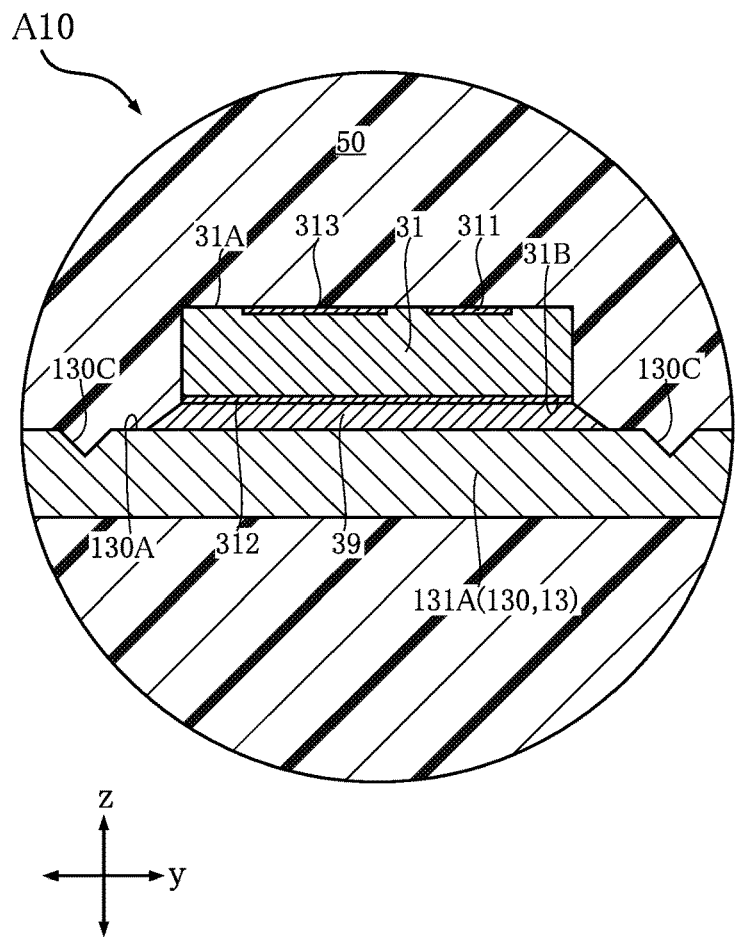
FIG. 14 is a partial cross-sectional view taken along a line XIV-XIV in FIG. 3.

As shown in FIG. 3, a plurality of first switching elements 31 are electrically connected respectively to the plurality of first pad sections 130. As shown in FIG. 9, FIG. 10, and FIG. 14, the plurality of first pad sections 130 each include a main face 130A oriented upward (direction in which the main face 111A of the mounting base 111 is oriented, in the thickness direction z). The main face 130A may be covered, for example, with a silver-plated layer. The plurality of first pad sections 130 include a plurality of regions. In the example shown in FIG. 3, the plurality of first pad sections 130 include a first region 131A, a second region 131B, and a third region 131C, respectively.

As shown in FIG. 3, the first region 131A is located close to the second suspension section 125. At least a part of the first region 131A is located adjacent to the second suspension section 125, in the first direction x. In the second direction y, the first region 131A is located adjacent to the second belt-like section 122B. As shown in FIG. 3 and FIG.

10, the first region 131A includes a pair of holes 130B penetrating therethrough in the thickness direction z. The pair of holes 130B are configured to space apart from each other in the second direction y, across the first switching element 31. As shown in FIG. 3 and FIG. 14, the first region 131A includes a plurality of grooves 130C, recessed from the main face 130A. The plurality of grooves 130C are located along the periphery of the first switching element 31, with a spacing from each other. The plurality of grooves 130C may be formed, for example, through a V-notch process. The plurality of grooves 130C serve to block the solder for bonding the first switching element 31 to the first region 131A, like other grooves to be subsequently described.

As shown in FIG. 3 and FIG. 4, the second region 131B is located adjacent to the first belt-like section 121 of the second lead 12, in the first direction x. The second region 131B includes a groove 130C. The grooves 130C is located on the right of the first switching element 31.

As shown in FIG. 3, the third region 131C is located adjacent to the second joint section 124 of the second lead 12, in the first direction x. In the second direction y, the third region 131C is located adjacent to the second belt-like section 122A of the second lead 12. The third region 131C includes a grooves 130C. The grooves 130C is located on the left of the first switching element 31.

Figure 6:
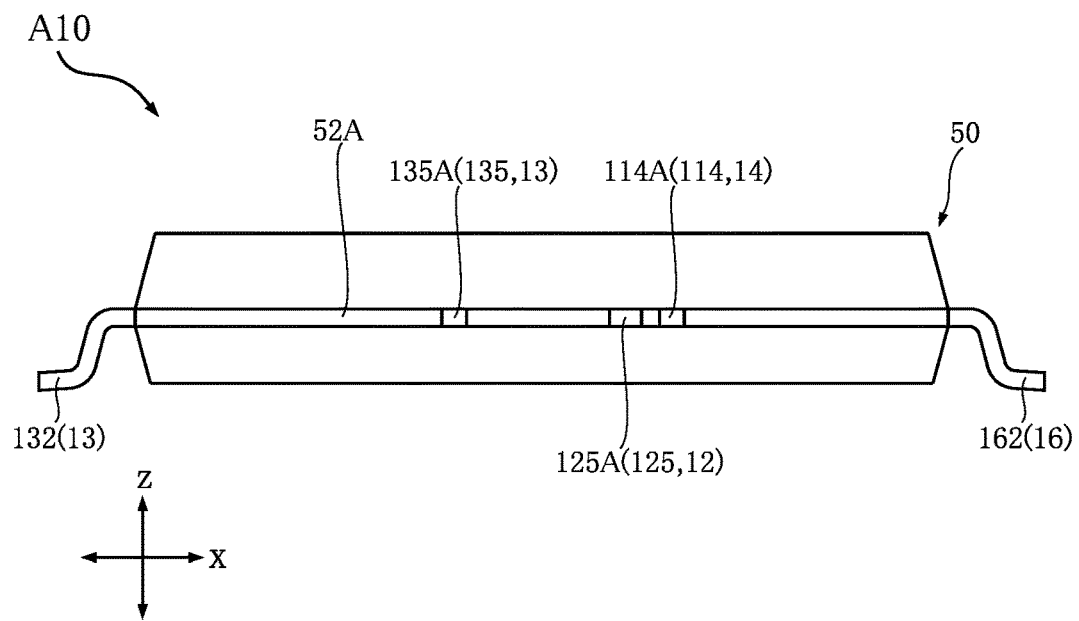
FIG. 6 is a rear view of the semiconductor device shown in FIG. 1.

As shown in FIG. 2 and FIG. 3, the third terminal section 132 protrudes to the right from the sealing resin 50, when viewed in the thickness direction z. The third terminal section 132 is bent, when viewed in the second direction y, as shown in FIG. 6. The third terminal section 132 may be covered with, for example, a tin-plated layer, or a tin-silver alloy-plated layer.

As shown in FIG. 3, the third joint section 133 serves to connect between the plurality of first pad sections 130 and the third terminal section 132. The third joint section 133 includes an outer joint section 133A, a first inner joint section 133B, and a second inner joint section 133C.

As shown in FIG. 3, the outer joint section 133A is connected to the first region 131A and the third terminal section 132. The outer joint section 133A extends in the first direction x.

As shown in FIG. 3, the first inner joint section 133B is connected to the first region 131A and the second region 131B. As shown in FIG. 4, the first inner joint section 133B includes a first belt-like region 136A extending from the first region 131A in the first direction x, and a second belt-like region 137A extending from the second region 131B in the second direction y. At the end of the second belt-like region 137A connected to the second region 131B, a groove 133D is provided. The groove 133D is recessed from the surface of the third joint section 133. The grooves 133D is formed by the same method as forming the groove 130C.

As shown in FIG. 3, the second inner joint section 133C is connected to the second region 131B and the third region 131C. As shown in FIG. 4, the second inner joint section 133C includes a first belt-like region 136B extending from the third region 131C in the first direction x, and a second belt-like region 137B extending from the second region 131B in the second direction y. At the end of the first belt-like region 136B connected to the third region 131C, and at the end of the second belt-like region 137B connected to the second region 131B, a groove 133D is provided.

As shown in FIG. 3, a part of the second region 131B protrudes to the right, from both of the first inner joint section 133B and the second inner joint section 133C. As shown in FIG. 4, a length La of the second belt-like region 137A of the first inner joint section 133B is shorter than a length Lb of the second belt-like region 137B of the second inner joint section 133C.

As shown in FIG. 3, the third suspension section 134 extends from the third region 131C in the second direction y. An end face 134A of the third suspension section 134 oriented in the second direction y is exposed from the sealing resin 50 (see FIG. 5). The end face 134A includes a pair of regions configured to space apart from each other in the first direction x. At the end of the third suspension section 134 connected to the third region 131C, a plurality of grooves 134B are provided. The plurality of grooves 134B are recessed from the surface of the third suspension section 134. The plurality of grooves 134B are formed by the same method as forming the plurality of grooves 130C.

As shown in FIG. 3, the third auxiliary suspension section 135 extends from the outer joint section 133A in the second direction y. An end face 135A of the third auxiliary suspension section 135 oriented in the second direction y is exposed from the sealing resin 50 (see FIG. 6).

Figure 11:
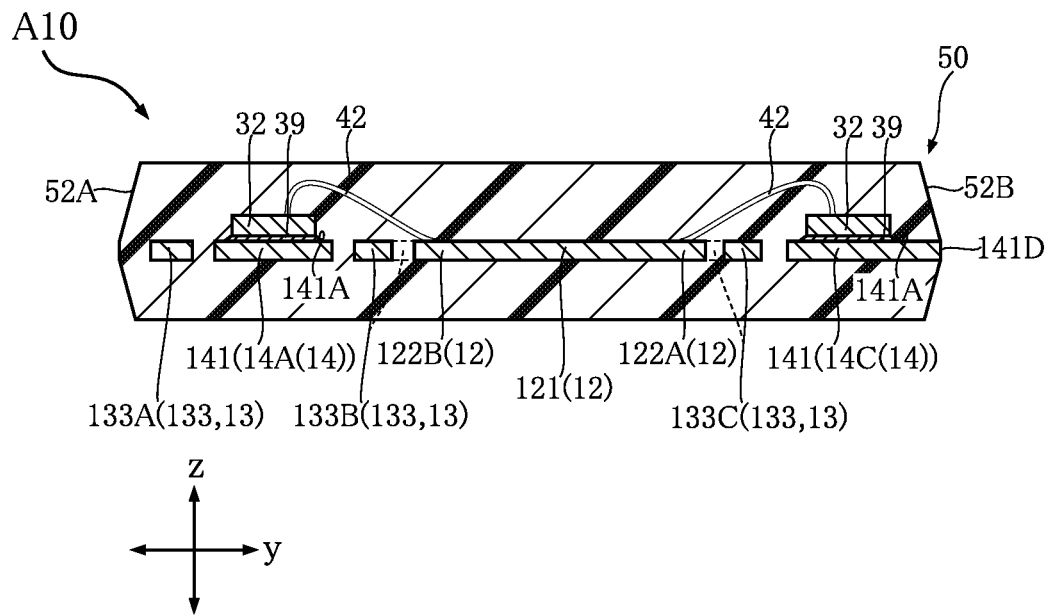
FIG. 11 is a cross-sectional view taken along a line XI-XI in FIG. 3.

As shown in FIG. 11, the first belt-like section 121 overlaps with the second region 131B, the first inner joint section 133B, and the second inner joint section 133C, when viewed in the first direction x. As shown in FIG. 4, a part of each of the pair of second belt-like sections 122A and 122B is located between the first inner joint section 133B and the second inner joint section 133C.

The plurality of fourth leads 14 are located on the right of the third lead 13, as shown in FIG. 3. The plurality of fourth leads 14 each include a second pad section 141 and a fourth terminal section 142.

As shown in FIG. 3, the second switching element 32 is electrically connected to each of the second pad sections 141. The second pad section 141 includes a main face 141A. The main face 130A may be covered, for example, with a silver-plated layer.

As shown in FIG. 2 and FIG. 3, the fourth terminal sections 142 each protrude to the right from the sealing resin 50, when viewed in the thickness direction z. The fourth terminal sections 142 are each connected to the corresponding second pad section 141. The plurality of fourth terminal sections 142 are aligned in the second direction y, in alignment with the third terminal section 132. The fourth terminal sections 142 are each bent, when viewed in the second direction y, like the first to third terminal section (see FIG. 5 and FIG. 6). The fourth terminal sections 142 may be covered, for example, with a tin-plated layer or a tin-silver alloy-plated layer.

As shown in FIG. 3, the plurality of fourth leads 14 include a U-phase lead 14A, a V-phase lead 14B, and a W-phase lead 14C.

Figure 12:
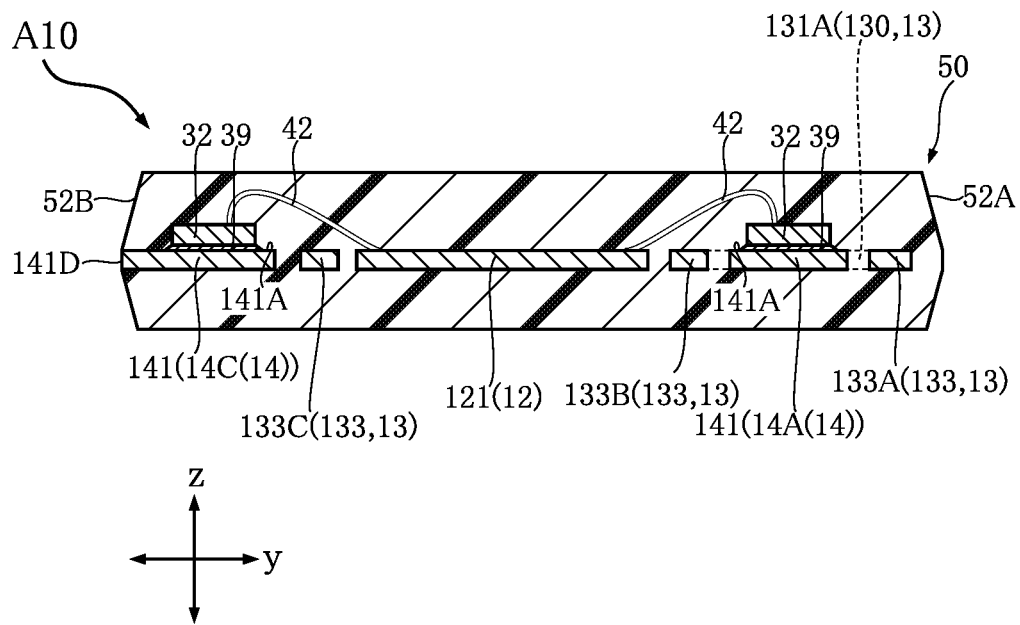
FIG. 12 is a cross-sectional view taken along a line XII-XII in FIG. 3.
Figure 13:
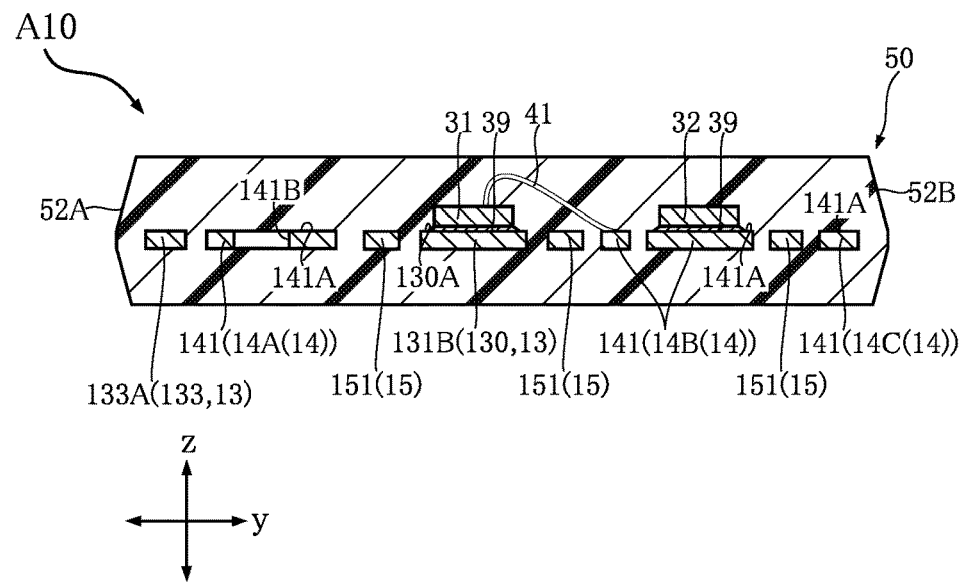
FIG. 13 is a cross-sectional view taken along a line XIII-XIII in FIG. 3.
Figure 15:
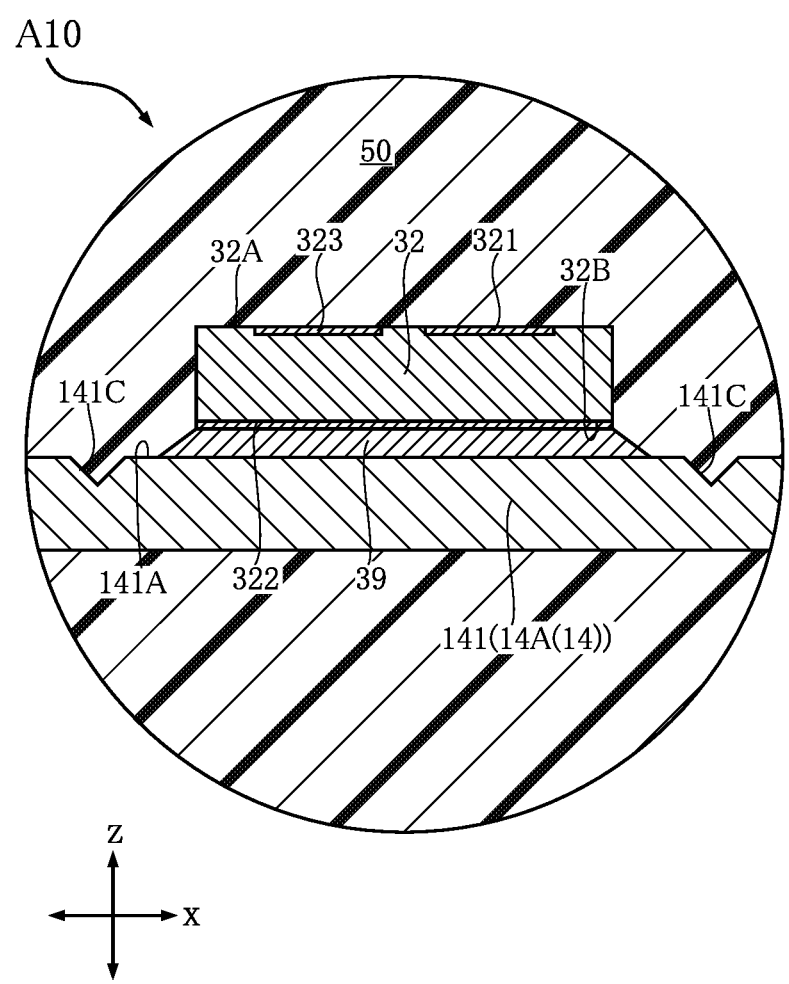
FIG. 15 is a partial cross-sectional view taken along a line XV-XV in FIG. 3.

As shown in FIG. 12, a part of the second pad section 141 of the U-phase lead 14A overlaps with the first region 131A, when viewed in the first direction x. A part of the second pad section 141 of the U-phase lead 14A is located between the outer joint section 133A and the first inner joint section 133B. As shown in FIG. 3 and FIG. 13, the second pad section 141 of the U-phase lead 14A includes a hole 141B penetrating therethrough in the thickness direction z. The hole 141B is located on the right of the second switching element 32. As shown in FIG. 3 and FIG. 15, the second pad section 141 of the U-phase lead 14A includes a plurality of grooves 141C, recessed from the main face 141A. The plurality of grooves 141C are located along the periphery of the second switching element 32. The plurality of grooves 141C are formed by the same method as forming the plurality of grooves 130C.

As shown in FIG. 3, the second pad section 141 of the V-phase lead 14B is located adjacent to the second inner joint section 133C, in the first direction x. The second pad section 141 of the V-phase lead 14B includes a plurality of grooves 141C. The plurality of grooves 141C are located along the periphery of the second switching element 32.

As shown in FIG. 3, the second pad section 141 of the W-phase lead 14C is located adjacent to both of the third region 131C and the third suspension section 134, in the first direction x. In the second direction y, the second pad section 141 of the W-phase lead 14C is located adjacent to the second inner joint section 133C. The second pad section 141 of the W-phase lead 14C includes a plurality of grooves 141C. The plurality of grooves 141C are located along the periphery of the second switching element 32.

The plurality of boot leads 15 are located on the right of the third lead 13, as shown in FIG. 3. The plurality of boot leads 15 are each located adjacent to the corresponding fourth lead 14, in the second direction y. The boot lead 15 includes a boot connecting section 151 and a boot terminal section 152.

As shown in FIG. 3, at least a part of each of the boot connecting sections 151 is located so as to overlap with the second pad section 141, in the second direction y. The surface of the boot connecting section 151 may be covered, for example, with a silver-plated layer.

As shown in FIG. 2 and FIG. 3, the boot terminal sections 152 each protrude to the right from the sealing resin 50, when viewed in the thickness direction z. The boot terminal sections 152 are each connected to the corresponding boot connecting section 151. The plurality of boot terminal sections 152 are aligned in the second direction y, in alignment with the third terminal section 132 and the plurality of fourth terminal sections 142. The boot terminal section 152 is bent when viewed in the second direction y, like the first to fourth terminal sections. The boot terminal section 152 may be covered, for example, with a tin-plated layer or a tin-silver alloy-plated layer.

The plurality of control leads 16 are located on the left of the first lead 11, as shown in FIG. 3. The control leads 16 each include a control connection section 161 and a control terminal section 162.

As shown in FIG. 3, the mounting base 111 includes a portion protruding to the left in the first direction x, with respect to the region 113A of the first joint section 113 and the first suspension section 114. The plurality of control connection sections 161 are configured to space apart from each other along a generally arcuate curve (or a polyline), and each opposed to the protruding portion of the mounting base 111. The surface of the control connection section 161 may be covered, for example, with a silver-plated layer.

As shown in FIG. 2 and FIG. 3, the control terminal sections 162 each protrude to the left from the sealing resin 50, when viewed in the thickness direction z. The control terminal sections 162 are each connected to the corresponding control connection section 161. The plurality of control terminal sections 162 are aligned in the second direction y, in alignment with the first terminal section 112 and the second terminal section 123. The control terminal sections 162 are bent when viewed in the second direction y, as shown in FIG. 6, like other terminal sections. The control terminal section 162 may be covered, for example, with a tin-plated layer or a tin-silver alloy-plated layer.

The IC 20 is configured to be mounted on the mounting base 111, as shown in FIG. 3, FIG. 9, and FIG. 10. The IC 20 includes, for example, a controller circuit 21 and a driver circuit 22 (see FIG. 16). The controller circuit 21 controls the driver circuit 22. The driver circuit 22 outputs a gate voltage for driving the plurality of first switching elements 31 and the plurality of second switching elements 32. The IC 20 extends in the first direction x, when viewed in the thickness direction z. A plurality of electrodes 20A are provided on the surface of the IC 20. The electrodes 20A are electrically connected to one of the controller circuit 21 and the driver circuit 22. As shown in FIG. 3, some of the plurality of electrodes 20A are electrically connected respectively to the plurality of first switching elements 31 and the plurality of second switching elements 32. The remaining electrodes 20A are electrically connected respectively to first lead 11, the second lead 12, the plurality of boot leads 15, and the plurality of control lead 16. The electrodes 20A may be formed of, for example, aluminum (Al).

As shown in FIG. 9 and FIG. 10, the semiconductor device A10 includes a bonding layer 29. The bonding layer 29 is interposed between the main face 111A of the mounting base 111 and the IC 20. The bonding layer 29 is, for example, formed of a silver paste. The silver may be obtained, for example, by mixing fine particles of silver in an epoxy resin. The IC 20 is bonded to the main face 111A, by means of the bonding layer 29.

The plurality of first switching elements 31 are electrically connected to the main face 130A of the respective first pad sections 130 (third leads 13), as shown in FIG. 3, FIG. 9, and FIG. 10. In the semiconductor device A10, accordingly, the first switching elements 31 are electrically connected to the first region 131A, the second region 131B, and the third region 131C, respectively. The plurality of first switching elements 31 are electrically connected respectively to the plurality of second pad sections 141 (fourth leads 14). The plurality of first switching elements 31 may each be a metal-oxide-semiconductor field-effect transistor (MOSFET) predominantly composed of silicon (Si) or silicon carbide (SiC). Other types of semiconductor element than the MOSFET may be employed as the plurality of first switching elements 31. In this embodiment, it will be assumed that the first switching element 31 in the semiconductor device A10 is an n-channel MOSFET. As shown in FIG. 14, the first switching elements 31 each include a first element main face 31A, a first element back face 31B, a first main face electrode 311, a first back face electrode 312, and a first gate electrode 313. The first element main face 31A and the first element back face 31B are oriented in opposite directions, in the thickness direction z.

The first main face electrode 311 is provided on the first element main face 31A, as shown in FIG. 3 and FIG. 14. The first main face electrode 311 is the source electrode of the first switching element 31.

As shown in FIG. 14, the first back face electrode 312 is formed so as to cover the entirety of the first element back face 31B. The first back face electrode 312 is the drain electrode of the first switching element 31.

The first gate electrode 313 is provided on the first element main face 31A, as shown in FIG. 3 and FIG. 14. The first gate electrode 313 is the gate electrode of the first switching element 31. The first gate electrode 313 is smaller in area than the first main face electrode 311, when viewed in the thickness direction z.

The plurality of second switching elements 32 are electrically connected to the main face 141A of the respective second pad sections 141 (fourth leads 14), as shown in FIG. 3, FIG. 11, and FIG. 13. In the semiconductor device A10, accordingly, the second switching element 32 are electrically connected to the U-phase lead 14A, the V-phase lead 14B, and the W-phase lead 14C, respectively. The plurality of second switching elements 32 are electrically connected to the second lead 12. The plurality of second switching elements 32 are the same type of semiconductor elements as the plurality of first switching elements 31. As shown in FIG. 15, the second switching elements 32 each include a second element main face 32A, a second element back face 32B, a second main face electrode 321, a second back face electrode 322, and a second gate electrode 323. The second element main face 32A and the second element back face 32B are oriented in opposite directions, in the thickness direction z.

The second main face electrode 321 is provided on the second element main face 32A, as shown in FIG. 3 and FIG. 15. The second main face electrode 321 is the source electrode of the second switching element 32.

As shown in FIG. 15, the second back face electrode 322 is formed so as to cover the entirety of the second element back face 32B. The second back face electrode 322 is the drain electrode of the second switching element 32.

The second gate electrode 323 is provided on the second element main face 32A, as shown in FIG. 3 and FIG. 15. The second gate electrode 323 is the gate electrode of the second switching element 32. The second gate electrode 323 is smaller in area than the second main face electrode 321, when viewed in the thickness direction z.

The semiconductor device A10 includes a plurality of conductive bonding layers 39, as shown in FIG. 9 to FIG. 15. Some of the plurality of conductive bonding layers 39 are interposed between the main face 130A of the respective first pad sections 130, and the first back face electrode 312 of the corresponding first switching element 31. The remaining conductive bonding layers 39 are each interposed between the main face 141A of the second pad sections 141 and the second back face electrode 322 of the corresponding second switching element 32. The plurality of first switching elements 31 are electrically connected respectively to the plurality of main faces 130A, by means of the corresponding conductive bonding layer 39. Accordingly, the plurality of first back face electrodes 312 are electrically connected to the third lead 13. The plurality of second switching elements 32 are electrically connected respectively to the plurality of main faces 141A, by means of the corresponding conductive bonding layer 39. Accordingly, the plurality of second back face electrodes 322 are electrically connected respectively to the plurality of fourth leads 14. The plurality of conductive bonding layers 39 may be, for example, a lead-free solder predominantly composed of tin.

The plurality of first wires 41 are each connected between the first main face electrode 311 of one of the first switching elements 31, and one of the second pad sections 141, as shown in FIG. 3. The plurality of fourth leads 14 are electrically connected respectively to the plurality of first switching elements 31, by means of the corresponding first wire 41. The plurality of first wires 41 may be formed of, for example, gold (Au), copper, silver, or aluminum.

The plurality of second wires 42 are each connected between the second main face electrode 321 of one of the second switching elements 32, and the second lead 12 (pair of second belt-like sections 122A and 122B), as shown in FIG. 3. The plurality of second switching elements 32 are electrically connected to the second lead 12, by means of the corresponding second wire 42. The plurality of second wires 42 may be formed of, for example, gold, copper, silver, or aluminum.

The plurality of first gate wires 431, the plurality of second gate wires 432, the plurality of first potential wires 441, the second potential wires 442, the plurality of boot wires 45, the ground wire 46, and the plurality of control wires are respectively connected to the plurality of electrodes 20A of the IC 20, as shown in FIG. 3. The mentioned wires may be formed of, for example, gold, copper, silver, or aluminum.

In this embodiment, it will be assumed that the plurality of first wires 41, the plurality of second wires 42, the plurality of first gate wires 431, the plurality of second gate wires 432, the plurality of first potential wires 441, the second potential wire 442, the plurality of boot wires 45, the ground wire 46, and the plurality of control wires 47 are all formed of aluminum. In this case, the plurality of first wires 41 and the plurality of second wires 42 are larger in diameter than the plurality of first gate wires 431, the plurality of second gate wires 432, the plurality of first potential wires 441, the second potential wire 442, the plurality of boot wires 45, the ground wire 46, and the plurality of control wires 47. This is because, in the semiconductor device A10, a larger current runs through the plurality of first wires 41 and the plurality of second wires 42, than through the remaining wires. In the case where another material than aluminum (e.g., gold, copper, and silver) is employed to form the plurality of wires in the semiconductor device A10, the plurality of first wires 41 and the plurality of second wires 42 may be formed in a larger diameter than the remaining wires.

In the semiconductor device A10, the plurality of first wires 41, the plurality of second wires 42, the second potential wire 442, the plurality of boot wires 45, the ground wire 46, and the plurality of control wires 47 may be formed of copper, and the plurality of first gate wires 431, the plurality of second gate wires 432, and the plurality of first potential wires 441 may be formed of gold. In this way, the wires in the semiconductor device A10 may be formed of different materials, instead of a single material.

The plurality of first gate wires 431 are each connected between one of the electrodes 20A of the IC 20, and the first gate electrode 313 of one of the first switching elements 31, as shown in FIG. 3. The plurality of first gate electrodes 313 are electrically connected to the driver circuit 22 of the IC 20, via the respective first gate wires 431 (see FIG. 16). The gate voltage outputted from the driver circuit 22 is individually applied to the plurality of first gate electrodes 313, via the corresponding first gate wire 431.

The plurality of second gate wires 432 are each connected between one of the electrodes 20A of the IC 20, and the second gate electrode 323 of one of the second switching elements 32, as shown in FIG. 3. The plurality of second gate electrodes 323 are electrically connected to the driver circuit 22 of the IC 20, via the respective second gate wire 432 (see FIG. 16). The gate voltage outputted from the driver circuit 22 is individually applied to the plurality of second gate electrodes 323, via the corresponding second gate wire 432.

The plurality of first potential wires 441 are each connected between one of the electrodes 20A of the IC 20, and the first main face electrode 311 of one of the first switching elements 31, as shown in FIG. 3. The plurality of first main face electrodes 311 are electrically connected to the driver circuit 22 of the IC 20, via the respective first potential wires 441 (see FIG. 16). The plurality of first main face electrodes 311 are electrically connected respectively to the plurality of fourth leads 14. A negative potential of the gate power supply for generating the gate voltage to drive the plurality of first switching elements 31 differs with respect to each of the first switching elements 31. In addition, it is required that the gate voltage is higher than the gate voltage for driving the plurality of second switching elements 32. From such a viewpoint, the gate power supply for generating the gate voltage for the first switching elements 31 includes a plurality of capacitors C shown in FIG. 16, electrically connected to the semiconductor device A10. The plurality of capacitors C are respectively associated with the plurality of first switching elements 31. The plurality of first potential wires 441 transmit the negative potential of the respective capacitors C, to the driver circuit 22 of the IC 20.

The second potential wire 442 is connected between one of the electrodes 20A of the IC 20 and the second lead 12, as shown in FIG. 3. The second main face electrode 321 of each of the second switching elements 32 is electrically connected to the controller circuit 21 of the IC 20, via the second wire 42, the second lead 12, and the second potential wire 442 (see FIG. 16). This means that the negative potential of the gate power supply for generating the gate voltage to drive the plurality of second switching elements 32 is common to all of the second switching elements 32. The gate power supply is included in the power supply for driving the IC 20. The second potential wire 442 transmits the potential of the second main face electrode 321 of the plurality of second switching elements 32 to the controller circuit 21 of the IC 20. In addition, the source current from the plurality of second switching elements 32 is detected by the controller circuit 21, via the second potential wire 442.

The plurality of boot wires 45 are respectively connected between the plurality of electrodes 20A of the IC 20 and the plurality of boot connecting sections 151, as shown in FIG. 3. The plurality of boot leads 15 are electrically connected to the driver circuit 22 of the IC 20, via the respective boot wires 45 (see FIG. 16).

The ground wire 46 is connected between one of the electrodes 20A of the IC 20 and the first joint section 113, as shown in FIG. 3. The first lead 11 is electrically connected to the controller circuit 21 of the IC 20, via the ground wire 46 (see FIG. 16).

The plurality of control wires 47 are respectively connected between the plurality of electrodes 20A of the IC 20 and the plurality of control connection sections 161, as shown in FIG. 3. The plurality of control leads 16 are electrically connected to the controller circuit 21 of the IC 20, via the respective control wires 47 (see FIG. 16).

The sealing resin 50 is arranged to cover, as shown in FIG. 3, a part of each of the first lead 11, the second lead 12, the third lead 13, the plurality of fourth leads 14, the plurality of boot leads 15, and the plurality of control leads 16. The sealing resin 50 is arranged also to cover the IC 20, the plurality of first switching elements 31, and the plurality of second switching elements 32, as shown in FIG. 3. The sealing resin 50 may be formed of, for example, a black epoxy resin. As shown in FIG. 2 and FIG. 5 to FIG. 8, the sealing resin 50 includes a pair of first side faces 51A and 51B, and a pair of second side faces 52A and 52B.

Figure 7:
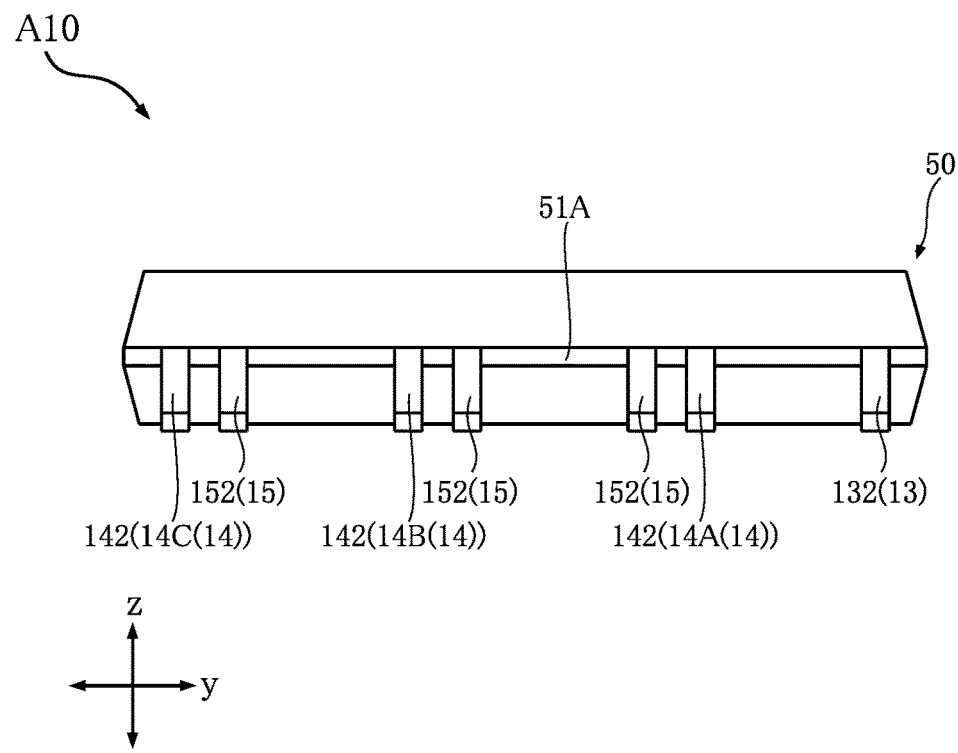
FIG. 7 is a right-side view of the semiconductor device shown in FIG. 1.
Figure 8:
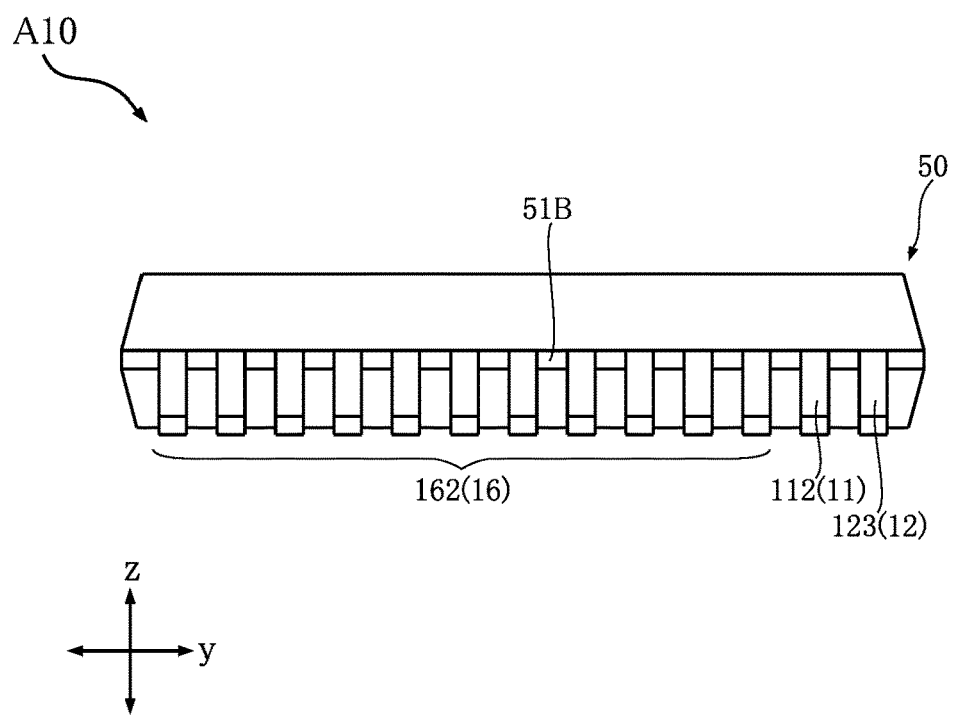
FIG. 8 is a left-side view of the semiconductor device shown in FIG. 1.

As shown in FIG. 2, FIG. 7, and FIG. 8, the pair of first side faces 51A and 51B are configured to space apart from each other in the first direction x. In FIG. 2, the first side face 51A is oriented to the right, and the first side face 51B is oriented to the left. The third terminal section 132, the plurality of fourth terminal sections 142, and the plurality of boot terminal sections 152 protrude to the right from the first side face 51A, when viewed in the thickness direction z. Likewise, the first terminal section 112, the second terminal section 123, and the plurality of control terminal sections 162 protrude to the left from the first side face 51B, when viewed in the thickness direction z.

As shown in FIG. 2, FIG. 5, and FIG. 6, the pair of second side faces 52A and 52B are configured to space apart from each other in the second direction y. In FIG. 2, the second side face 52A is oriented upward, and the second side face 52B is oriented downward. As shown in FIG. 6, an end face 114A of the first suspension section 114, an end face 125A of the second suspension section 125, and an end face 135A of the third auxiliary suspension section 135 are exposed from the second side face 52A. As shown in FIG. 5, an end face 126A of the second auxiliary suspension section 126, an end face 134A of the third suspension section 134, and an end face 141D of the second pad section 141 (W-phase lead 14C) are exposed from the second side face 52B.

Figure 16:
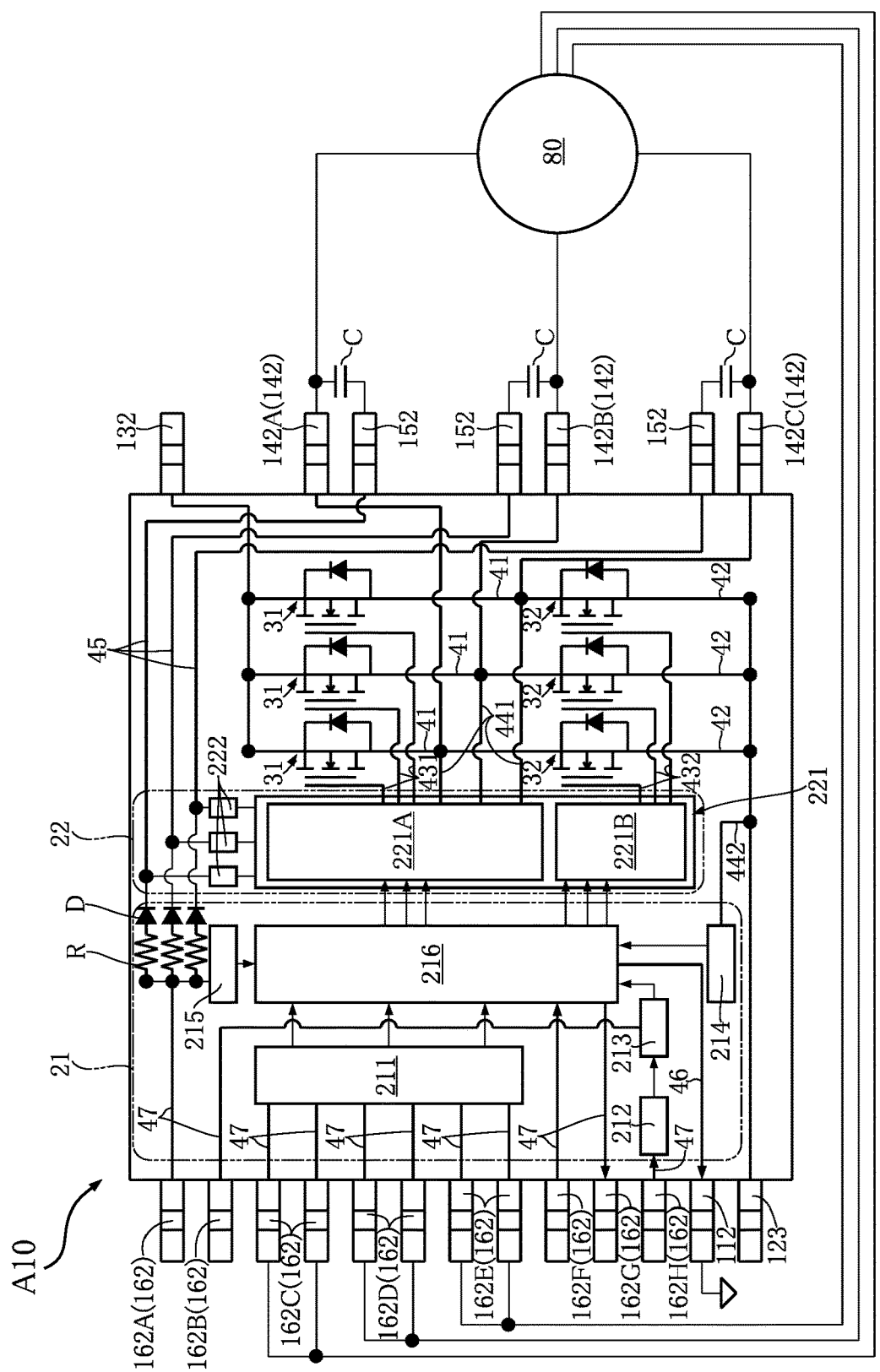
FIG. 16 is a functional block diagram of the semiconductor device shown in FIG. 1.

Referring now to FIG. 16, a circuit configuration of the semiconductor device A10 will be described hereunder.

The plurality of fourth terminal sections 142 include a U-phase output terminal 142A, a V-phase output terminal 142B, and a W-phase output terminal 142C. The U-phase output terminal 142A corresponds to the fourth terminal section 142 of the U-phase lead 14A. The V-phase output terminal 142B corresponds to the fourth terminal section 142 of the V-phase lead 14B. The W-phase output terminal 142C corresponds to the fourth terminal section 142 of the W-phase lead 14C. The plurality of control terminal sections 162 include a VCC terminal 162A, a VSP terminal 162B, a pair of HU terminals 162C, a pair of HV terminals 162D, a pair of HW terminals 162E, an FGS terminal 162F, an FG terminal 162G, and an RT terminal 162H.

As shown in FIG. 16, a motor 80, the target of the operation control, is connected to the semiconductor device A10. The motor 80 is a brushless DC motor. The motor 80 is electrically connected to the U-phase output terminal 142A, the V-phase output terminal 142B, the W-phase output terminal 142C, the pair of HU terminals 162C, the pair of HV terminals 162D, and the pair of HW terminals 162E. The U-phase output terminal 142A, the V-phase output terminal 142B, and the W-phase output terminal 142C are electrically connected respectively to three stators (not shown) of the motor 80. The pair of HU terminals 162C, the pair of HV terminals 162D, and the pair of HW terminals 162E are electrically connected respectively to three Hall elements (not shown) provided inside the motor 80.

The controller circuit 21 of the IC 20 includes a Hall amplifier 211, a triangular wave generator 212, a PWM signal converter 213, an over current protector 214, a first under-voltage protector 215, and a three-phase distribution logic 216.

The Hall amplifier 211 is electrically connected to the pair of HU terminals 162C, the pair of HV terminals 162D, and the pair of HW terminals 162E, via the respective control wires 47. The Hall amplifier 211 amplifies each of three Hall voltages outputted from the Hall element provided inside the motor 80. The Hall voltages are signals each indicating a position around the axial line of the rotor (not shown) of the motor 80. The three Hall voltages amplified by the Hall amplifier 211 are inputted to the three-phase distribution logic 216.

The triangular wave generator 212 is electrically connected to the RT terminal 162H, via the control wire 47. The triangular wave generator 212 generates a triangular wave, according to the signal inputted to the RT terminal 162H. The triangular wave serves as a carrier signal for controlling the driver circuit 22 through a pulse width modulation (PWM) control. The carrier signal is inputted to the PWM signal converter 213.

The PWM signal converter 213 is electrically connected to the VSP terminal 162B, via the control wire 47. From the VSP terminal 162B, a modulation wave signal that serves as the base for driving the motor 80 is inputted. The modulation wave signal has a sine wave form. The PWM signal converter 213 converts the carrier signal inputted from the triangular wave generator 212 and the modulation wave signal inputted from the VSP terminal 162B into a PWM signal, which has a pulse wave form, according to the comparison therebetween. The PWM signal is inputted to the three-phase distribution logic 216.

The over current protector 214 is electrically connected to the plurality of second switching elements 32, via the second potential wire 442, the second lead 12, and the plurality of second wires 42. The over current protector 214 detects the source current running through the plurality of second switching elements 32. The over current protector 214 generates a signal based on the detection result of the source current. The signal is inputted to the three-phase distribution logic 216.

The first under-voltage protector 215 is electrically connected to the VCC terminal 162A, via the control wire 47. To the VCC terminal 162A, the current for driving the IC 20 is inputted. Accordingly, the potential at the VCC terminal 162A corresponds to the positive potential of the power supply for driving the IC 20. The first under-voltage protector 215 prevents a voltage applied by the VCC terminal 162A to the IC 20 from falling below a threshold.

The three-phase distribution logic 216 distributes the PWM signal inputted from the PWM signal converter 213 to three phases, namely the pair of U-phase signals, the pair of V-phase signals, and the pair of W-phase signals, according to the Hall voltage inputted from the Hall amplifier 211. In the semiconductor device A10, the pair of U-phase signals, the pair of V-phase signals, and the pair of W-phase signals are each a rectangular wave signal of a 120 degrees conduction type. The phase difference of the V-phase signal from the U-phase signal, and the phase difference of the W-phase signal from the V-phase signal, are both 120 degrees. One each of the U-phase signals, the V-phase signals, and the W-phase signals are inputted to a high-side region 221A (to be subsequently described in detail) of a gate driver 221 of the driver circuit 22. The other of each of the U-phase signals, the V-phase signals, and the W-phase signals are inputted to a low-side region 221B (to be subsequently described in detail) of the gate driver 221 of the driver circuit 22. The pair of U-phase signals, the pair of V-phase signals, and the pair of W-phase signals are adjusted as appropriate, according to the signal inputted from the over current protector 214.

The three-phase distribution logic 216 is electrically connected to the first terminal section 112, via the ground wire 46. The first terminal section 112 is the ground terminal of the IC 20. Accordingly, the potential at the first terminal section 112 corresponds to the negative potential of the power supply for driving the IC 20. The three-phase distribution logic 216 is also electrically connected to the FG terminal 162G and the FGS terminal 162F, via the pair of control wires 47. The three-phase distribution logic 216 generates a frequency generator (FG) signal indicating the rotation speed of the motor 80, according to the Hall voltage inputted from the Hall amplifier 211. The FG signal is outputted to the FG terminal 162G. To the FGS terminal 162F, a command signal for determining the number of pulses of the FG signal outputted from the FG terminal 162G, is inputted.

The driver circuit 22 of the IC 20 includes the gate driver 221 and a plurality of second under-voltage protectors 222.

The gate driver 221 drives each of the plurality of first switching elements 31 and the plurality of second switching elements 32, according to the pair of U-phase signals, the pair of V-phase signals, and the pair of W-phase signals inputted from the three-phase distribution logic 216. The gate driver 221 includes the high-side region 221A and the low-side region 221B.

In the high-side region 221A, a plurality of drive circuits are provided. The plurality of drive circuits in the high-side region 221A respectively convert one each of the U-phase signals, the V-phase signals, and the W-phase signals, inputted from the three-phase distribution logic 216, into a plurality of gate voltages. The plurality of such gate voltages respectively correspond to the positive potential of the U-phase signal, the V-phase signal, and the W-phase signal. The plurality of such gate voltages are respectively applied to the plurality of first switching elements 31, via the plurality of first gate wires 431. This is how the plurality of first switching elements 31 are driven.

In the low-side region 221B, a plurality of drive circuits are provided. The plurality of drive circuits in the low-side region 221B respectively convert the other of each of the U-phase signals, the V-phase signals, and the W-phase signals, inputted from the three-phase distribution logic 216, into a plurality of gate voltages. The plurality of such gate voltages respectively correspond to the negative potential of the U-phase signal, the V-phase signal, and the W-phase signal. The plurality of such gate voltages are respectively applied to the plurality of second switching elements 32, via the plurality of second gate wires 432. This is how the plurality of second switching elements 32 are driven.

The plurality of second under-voltage protectors 222 are electrically connected respectively to the plurality of drive circuits provided in the high-side region 221A of the gate driver 221. The plurality of second under-voltage protectors 222 respectively prevent the voltage applied to the drive circuits from the plurality of capacitors C, from falling below a threshold.

In the semiconductor device A10, a DC power for driving the motor 80 is inputted to the third terminal section 132. The current of the DC power inputted to the third terminal section 132 sequentially flows through the plurality of first switching elements 31, the plurality of first wires 41, the plurality of second switching elements 32, and the plurality of second wires 42, and is outputted from the second terminal section 123.

The DC power inputted to the semiconductor device A10 is converted into a three-phase AC power, having the U-phase, the V-phase, and the W-phase, when the plurality of first switching elements 31 and the plurality of second switching elements 32 are driven. The U-phase AC power is outputted from the U-phase output terminal 142A. The V-phase AC power is outputted from the V-phase output terminal 142B. The W-phase AC power is outputted from the W-phase output terminal 142C. The motor 80 is driven by the three-phase AC power, outputted from the U-phase output terminal 142A, the V-phase output terminal 142B, and the W-phase output terminal 142C.

The plurality of capacitors C are each electrically connected to both of the fourth terminal section 142, and the boot terminal section 152 located adjacent thereto in the second direction y. The plurality of capacitors C are each charged with the power inputted to the VCC terminal 162A, when the second switching element 32, electrically connected to the first switching element 31 corresponding to the capacitor C, is on. The conduction path from the VCC terminal 162A to the capacitor C includes the control wire 47, a resistance R, a diode D, the boot wire 45, and the boot terminal section 152. The power charged to each of the plurality of capacitors C is inputted to one of the drive circuits provided in the high-side region 221A of the gate driver 221, via the boot terminal section 152, the boot wire 45, and the second under-voltage protector 222. Here, the plurality of first potential wires 441 are electrically connected respectively to the plurality of drive circuits.

The semiconductor device A10 provides the following advantageous effects.

The semiconductor device A10 includes the first lead 11 having the mounting base 111 elongate in the first direction x, and the second lead 12 including the first belt-like section 121 and the pair of second belt-like sections 122 (122A and 122B). The first belt-like section 121 is shifted from the mounting base 111 in the first direction x, and elongate in the second direction y. The second belt-like sections 122 each extend in the first direction x (to the left in FIG. 3), from the corresponding end 121A of the first belt-like section 121. The mounting base 111 overlaps with the first belt-like section 121, when viewed in the first direction x. At least a part of the mounting base 111 is located between the pair of second belt-like sections 122. The mentioned configuration enables reduction in outer size of the semiconductor device A10 in the second direction y, while keeping the outer size of the semiconductor device A10 in the first direction x at a predetermined value. In other words, the semiconductor device can be formed in a reduced size.

The first lead 11 includes the first joint section 113 (connected to the mounting base 111 and the first terminal section 112) and the first suspension section 114 (on the opposite side of the first joint section 113 in the second direction y, with respect to the mounting base 111). Accordingly, the mounting base 111 is supported on both sides in the second direction y, in the manufacturing process of the semiconductor device A10. Therefore, the mounting base 111 can be prevented from excessively tilting, when the IC 20 is mounted on the mounting base 111.

The second lead 12 includes the second joint section 124 (connected to one of the second belt-like sections 122 and the second terminal section 123) and the second suspension section 125 (extending from the other second belt-like section 122 in the second direction y). Accordingly, the first belt-like section 121 and the pair of second belt-like sections 122 are supported on both sides in the second direction y, in the manufacturing process of the semiconductor device A10. Therefore, the pair of second belt-like sections 122 can be prevented from excessively tilting, when the plurality of second wires 42 are connected to the pair of second belt-like sections 122.

In FIG. 3, the first joint section 113 is located on the left of the pair of second belt-like sections 122, in the first direction x. The first joint section 113 includes the region 113A, inclined with respect to both of the first direction x and the second direction y. Such a configuration prevents the outer size of the semiconductor device A10 in the first direction x from being excessively large.

The second terminal section 123 is located adjacent to the first terminal section 112 in the second direction y, and the second joint section 124 is located adjacent to the first joint section 113. The second joint section 124 includes the region 124A, inclined with respect to both of the first direction x and the second direction y. Such a configuration shortens the distance between the second joint section 124 and the first joint section 113 (region 113A).

In FIG. 3, the third lead 13 is located on the right of the second lead 12, in the first direction x. The plurality of first pad sections 130 of the third lead 13 include the first region 131A, the second region 131B, and the third region 131C, respectively. The first region 131A is located adjacent to the second suspension section 125, in the first direction x. The second region 131B is located adjacent to the first belt-like section 121, in the first direction x. The third region 131C is located adjacent to the second joint section 124, in the first direction x. Accordingly, the plurality of first switching elements 31 can be located along the outer periphery of the first belt-like section 121 and the pair of second belt-like sections 122. Such a configuration contributes to reducing the outer size of the semiconductor device A10 in the second direction y.

The third joint section 133 of the third lead 13 includes the first inner joint section 133B (connected to the first region 131A and the second region 131B) and the second inner joint section 133C (connected to the second region 131B and the third region 131C). The first belt-like section 121 overlaps with the second region 131B, the first inner joint section 133B, and the second inner joint section 133C, when viewed in the first direction x. A part of each of the pair of second belt-like sections 122 is located between the first inner joint section 133B and the second inner joint section 133C. Such a configuration shortens the distance between the third joint section 133, and the first belt-like section 121 and the pair of second belt-like sections 122.

In FIG. 3 and FIG. 4, the second region 131B protrudes with respect to the first inner joint section 133B and the second inner joint section 133C in the first direction x, and in the direction away from the first belt-like section 121. Such a configuration allows the distance between the second region 131B and the first belt-like section 121 to be shortened.

The third joint section 133 includes the outer joint section 133A connected to the first region 131A and the third terminal section 132. The third lead 13 includes the third suspension section 134 extending from the second inner joint section 133C in the second direction y. Accordingly, the plurality of first pad sections 130, the first inner joint section 133B, and the second inner joint section 133C are supported by both of the outer joint section 133A and the third suspension section 134, in the manufacturing process of the semiconductor device A10. Therefore, the plurality of first pad sections 130 can be prevented from excessively tilting, when the plurality of first switching elements 31 are to be bonded to the plurality of first pad sections 130.

The second pad section 141 of the U-phase lead 14A (fourth lead 14) overlaps with the first region 131A, when viewed in the first direction x. In FIG. 3, a part of the second pad section 141 is located between the outer joint section 133A and the first inner joint section 133B. Such a configuration allows the second switching element 32 to be located on the right of the first switching element 31 bonded to the first region 131A, in the first direction x.

The first inner joint section 133B includes the second belt-like region 137A extending from the second region 131B in the second direction y. The second inner joint section 133C includes the second belt-like region 137B extending from the second region 131B in the second direction y. As shown in FIG. 4, the length La of the second belt-like region 137A is shorter than the length Lb of the second belt-like region 137B. Such a configuration allows a space for locating the V-phase lead 14B and the W-phase lead 14C to be secured on the opposite side of the U-phase lead 14A in the second direction y, with respect to the second region 131B.

When viewed in the thickness direction z, the IC 20 has a belt-like shape extending in the first direction x, like the mounting base 111. Accordingly, the main face 111A of the mounting base 111 can be effectively utilized to mount the IC 20. In addition, forming the IC 20 in the elongate shape allows the controller circuit 21 and the driver circuit 22 to be integrally incorporated in the IC 20.

Referring now to FIG. 17 to FIG. 22, a semiconductor device A20 according to a second embodiment will be described hereunder. In these drawings, the elements same as or similar to those of the semiconductor device A10 are given the same numeral, and the description thereof will not be repeated.

Figure 17:
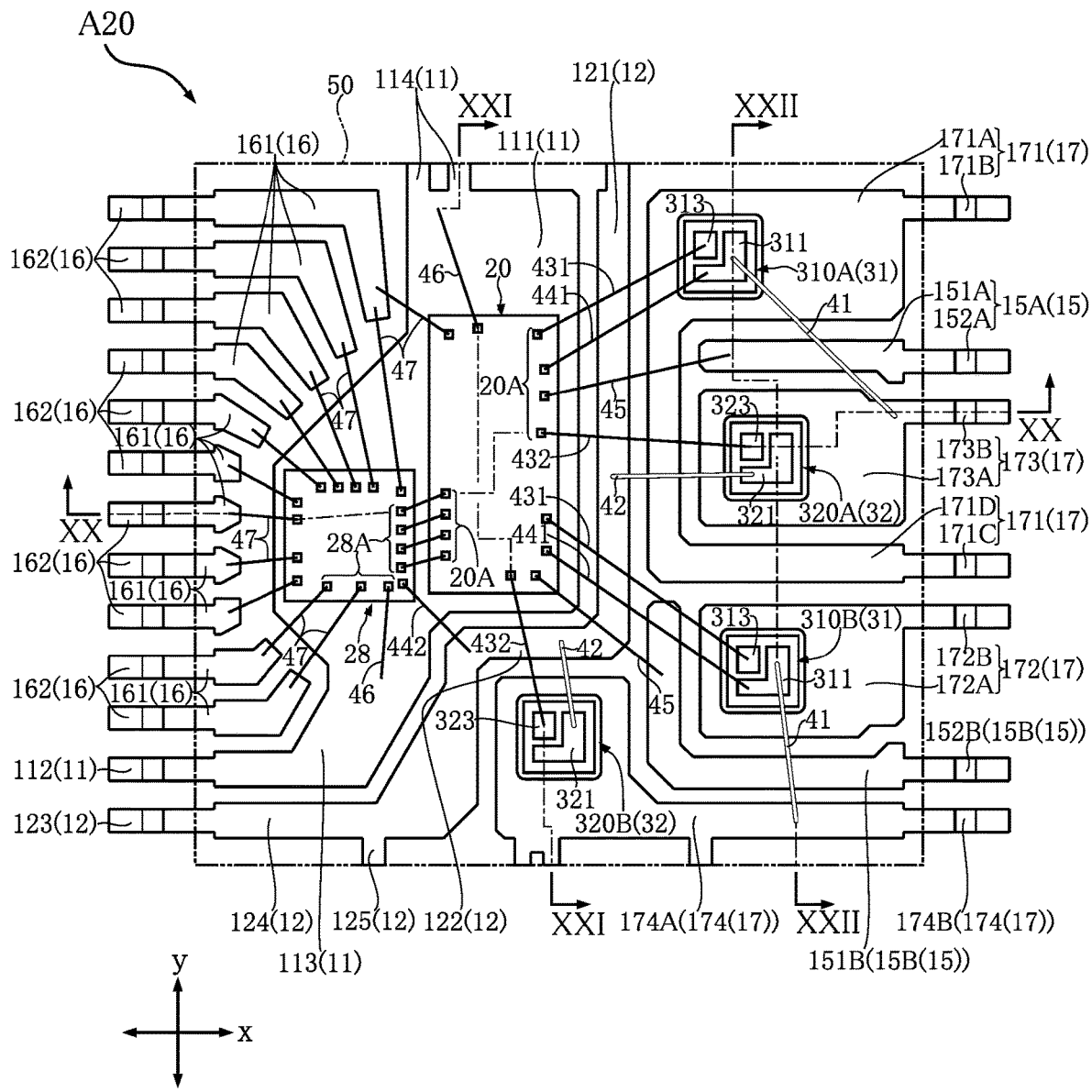
FIG. 17 is a plan view of a semiconductor device according to a second embodiment, seen through a sealing resin.
Figure 20:
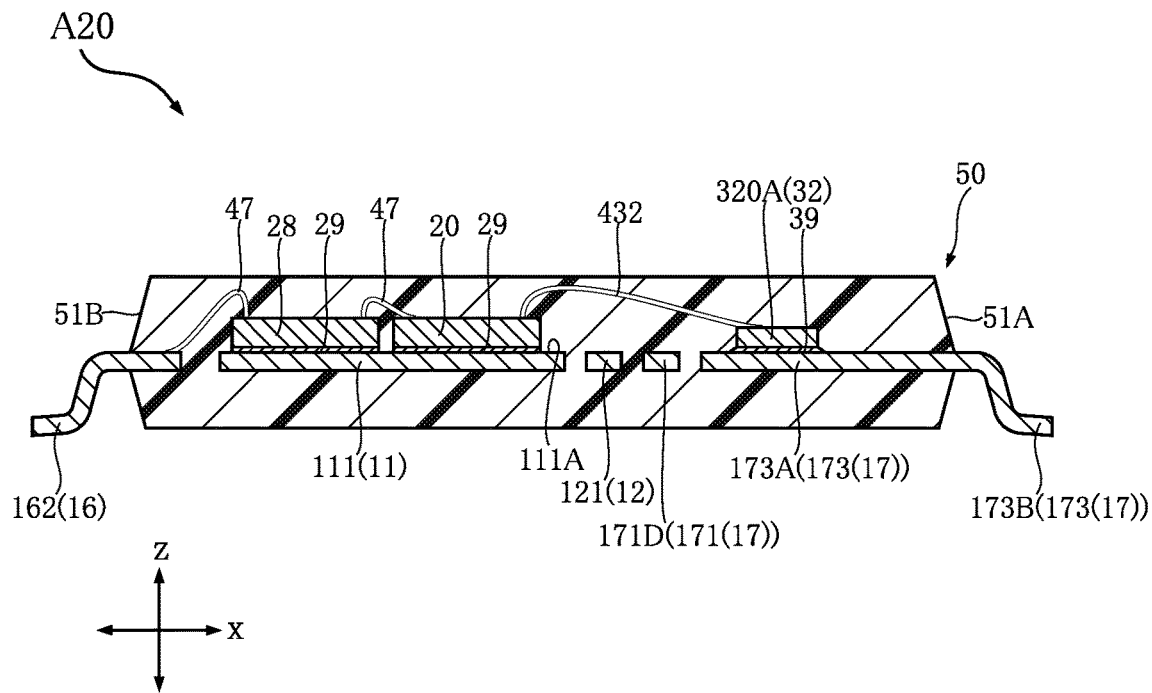
FIG. 20 is a cross-sectional view taken along a line XX-XX in FIG. 17.
Figure 21:
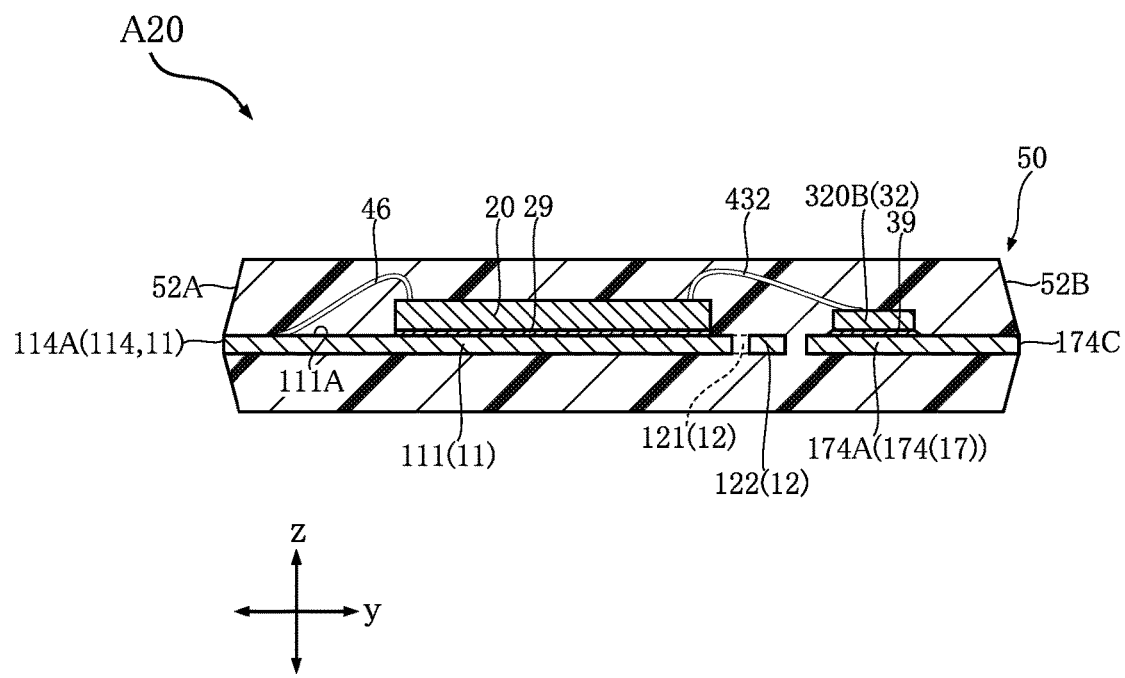
FIG. 21 is a cross-sectional view taken along a line XXI-XXI in FIG. 17.
Figure 22:
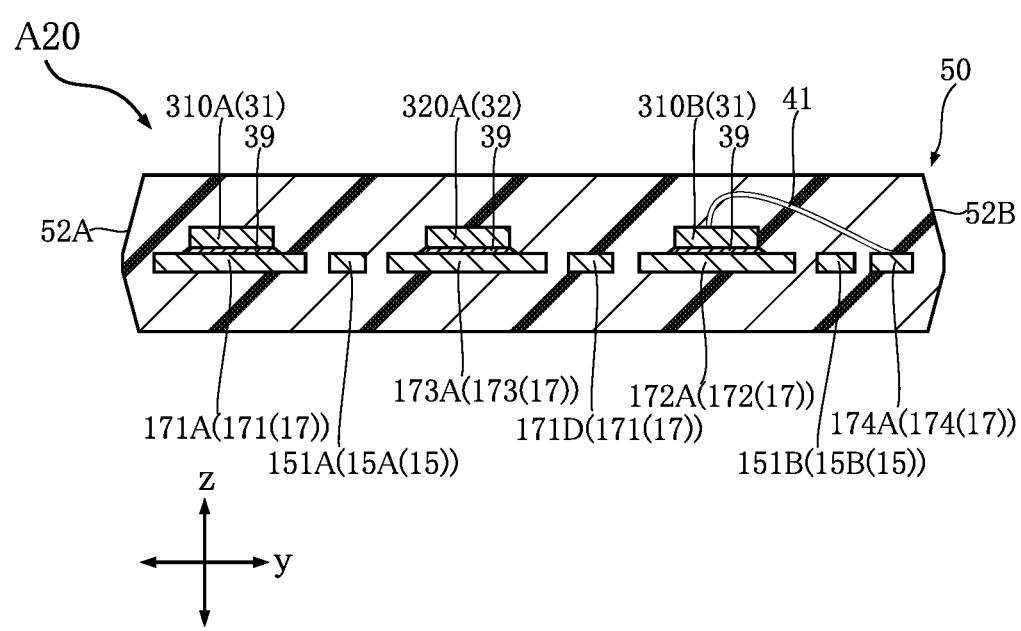
FIG. 22 is a cross-sectional view taken along a line XXII-XXII in FIG. 17.

The semiconductor device A20 includes the first lead 11, the second lead 12, a plurality of arm leads 17, the plurality of boot leads 15, the plurality of control leads 16, the IC 20, a control IC 28, the plurality of first switching elements 31, the plurality of second switching elements 32, and the sealing resin 50. The semiconductor device A20 also includes the plurality of first wires 41, the plurality of second wires 42, the plurality of first gate wires 431, the plurality of second gate wires 432, the plurality of first potential wires 441, the second potential wire 442, the plurality of boot wires 45, a plurality of ground wires 46, and the plurality of control wires 47. In FIG. 17, the mentioned elements are seen through the sealing resin 50, for the sake of clarity (see dash-dot-dot lines). FIG. 20 to FIG. 22 are cross-sectional views taken along dash-dot lines (XX-XX, XXI-XXI, XXII-XXII) in FIG. 17.

The semiconductor device A20 is applicable, for example, to control of the operation of a DC motor. A DC power supplied from outside to the semiconductor device A20 is controlled by the plurality of first switching elements 31 and the plurality of second switching elements 32.

The first lead 11, the second lead 12, the plurality of arm leads 17, the plurality of boot leads 15, and the plurality of control leads 16 are conductive materials constituted of the same lead frame. These conductive materials constitute a part of the conduction path between the IC 20, the control IC 28, the plurality of first switching elements 31, and the plurality of second switching elements 32, and a circuit board on which the IC 20 is mounted. The lead frame may be formed of copper (Cu) or a copper-based alloy. The plurality of control leads 16 have the same configuration as those of the semiconductor device A10.

The first lead 11 includes the mounting base 111, the first terminal section 112, the first joint section 113, and a pair of first suspension sections 114, as shown in FIG. 17.

As shown in FIG. 17, the mounting base 111 occupies the largest area in the first lead 11, when viewed in the thickness direction z. As shown in FIG. 20 and FIG. 21, the mounting base 111 includes the main face 111A oriented in the thickness direction z. The main face 111A may be covered, for example, with a silver-plated layer.

As shown in FIG. 17, the first terminal section 112 protrudes to the left from the sealing resin 50 in the first direction x, when viewed in the thickness direction z. The first terminal section 112 has the same configuration as that of the semiconductor device A10.

As shown in FIG. 17, the first joint section 113 is connected to the mounting base 111 and the first terminal section 112. The surface of the first joint section 113 (seen in FIG. 17) may be covered, for example, with a silver-plated layer.

As shown in FIG. 17, the pair of first suspension sections 114 are located on the opposite side of the first joint section 113 in the second direction y, with respect to the mounting base 111. The pair of first suspension sections 114 extend in the second direction y. Accordingly, the mounting base 111 is interposed between the first joint section 113 and the pair of first suspension sections 114, in the second direction y. The pair of first suspension sections 114 each include an end face 114A oriented in the second direction y. The pair of end faces 114A are exposed from the sealing resin 50 (see FIG. 19).

The second lead 12 is located on the right of the first lead 11 in the first direction x, as shown in FIG. 17. The second lead 12 includes the first belt-like section 121, the second belt-like section 122, the second terminal section 123, the second joint section 124, and the second suspension section 125.

As shown in FIG. 17, the first belt-like section 121 is located on the right of the mounting base 111, in the first direction x. The first belt-like section 121 extends in the second direction y. As shown in FIG. 21, the mounting base 111 overlaps with the first belt-like section 121, when viewed in the first direction x.

As shown in FIG. 17, the second belt-like section 122 extends to the left in the first direction x, from an end of the first belt-like section 121 in the second direction y. The first belt-like section 121 and the second belt-like section 122 are generally orthogonal to each other, when viewed in the thickness direction z. The second belt-like section 122 is located adjacent to the mounting base 111, in the second direction y. The respective surfaces of the first belt-like section 121 and the second belt-like section 122 may be covered, for example, with a silver-plated layer.

As shown in FIG. 17, the second terminal section 123 protrudes to the left from the sealing resin 50 in the first direction x, when viewed in the thickness direction z. The second terminal section 123 has the same configuration as that of the semiconductor device A10.

As shown in FIG. 17, the second joint section 124 is connected to the second belt-like section 122 and the second terminal section 123. The second joint section 124 is located adjacent to the first joint section 113, in the second direction y. The surface of the second joint section 124 may be covered, for example, with a silver-plated layer.

As shown in FIG. 17, the second suspension section 125 extends in the second direction y, from a portion of the second joint section 124 extending in the first direction x. The end face 125A of the second auxiliary suspension section 126 oriented in the second direction y is exposed from the sealing resin 50.

The plurality of arm leads 17 is located on the right of the second lead 12 in the first direction x, as shown in FIG. 17. The plurality of arm leads 17 include a first arm lead 171, a second arm lead 172, a third arm lead 173, and a fourth arm lead 174.

As shown in FIG. 17, the first arm lead 171 includes a pad section 171A, a first power supply terminal section 171B, a second power supply terminal section 171C, and a joint section 171D.

The pad section 171A is located adjacent to the first belt-like section 121, in the first direction x. The surface of the pad section 171A may be covered, for example, with a silver-plated layer.

Figure 19:
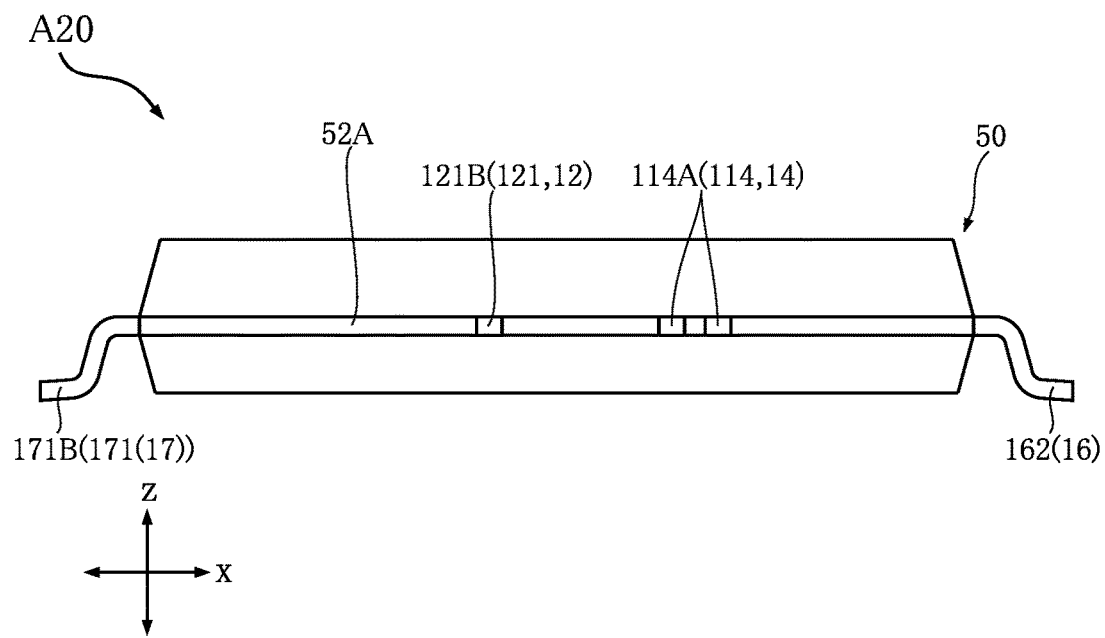
FIG. 19 is a rear view of the semiconductor device shown in FIG. 17.

The first power supply terminal section 171B protrudes to the right from the sealing resin 50 in the first direction x, when viewed in the thickness direction z. The first power supply terminal section 171B is connected to the pad section 171A. As shown in FIG. 19, the first power supply terminal section 171B is bent, when viewed in the second direction y. The fourth terminal section 142 may be covered, for example, with a tin-plated layer or a tin-silver alloy-plated layer.

In FIG. 17, the second power supply terminal section 171C protrudes to the right from the sealing resin 50 in the first direction x, when viewed in the thickness direction z. The second power supply terminal section 171C is bent like the first power supply terminal section 171B shown in FIG. 19, when viewed in the second direction y. The second power supply terminal section 171C may be covered, for example, with a tin-plated layer or a tin-silver alloy-plated layer.

The joint section 171D is connected to the pad section 171A and the second power supply terminal section 171C. The joint section 171D includes a portion extending from the pad section 171A in the second direction y, and a portion extending from the second power supply terminal section 171C in the first direction x. Accordingly, the joint section 171D has an L-shape, when viewed in the thickness direction z.

As shown in FIG. 17, the second arm lead 172 includes a pad section 172A and a third power supply terminal section 172B.

The pad section 172A is located adjacent to the joint section 171D of the first arm lead 171, in the second direction y. The surface of the pad section 172A may be covered, for example, with a silver-plated layer.

The third power supply terminal section 172B protrudes to the right from the sealing resin 50 in the first direction x, when viewed in the thickness direction z. The third power supply terminal section 172B is connected to the pad section 172A. The third power supply terminal section 172B is bent like the first power supply terminal section 171B shown in FIG. 19, when viewed in the second direction y. The third power supply terminal section 172B is located adjacent to the second power supply terminal section 171C, in the second direction y. The third power supply terminal section 172B may be covered, for example, with a tin-plated layer or a tin-silver alloy-plated layer.

As shown in FIG. 17, the third arm lead 173 includes a pad section 173A and a first output terminal section 173B.

The pad section 173A is located adjacent to the joint section 171D of the first arm lead 171, in the second direction y. In addition, the pad section 173A is located on the opposite side of the pad section 172A of the second arm lead 172 in the second direction y, with respect to the joint section 171D. The surface of the pad section 173A may be covered, for example, with a silver-plated layer.

The first output terminal section 173B protrudes to the right from the sealing resin 50 in the first direction x, when viewed in the thickness direction z. The first output terminal section 173B is connected to the pad section 173A. The first output terminal section 173B is bent like the first power supply terminal section 171B shown in FIG. 19, when viewed in the second direction y. The first output terminal section 173B may be covered, for example, with a tin-plated layer or a tin-silver alloy-plated layer.

As shown in FIG. 17, the fourth arm lead 174 includes a pad section 174A and a second output terminal section 174B.

The pad section 174A is located adjacent to the second joint section 124 in the first direction x, and to the second belt-like section 122 in the second direction y. The surface of the pad section 173A may be covered, for example, with a silver-plated layer.

Figure 18:
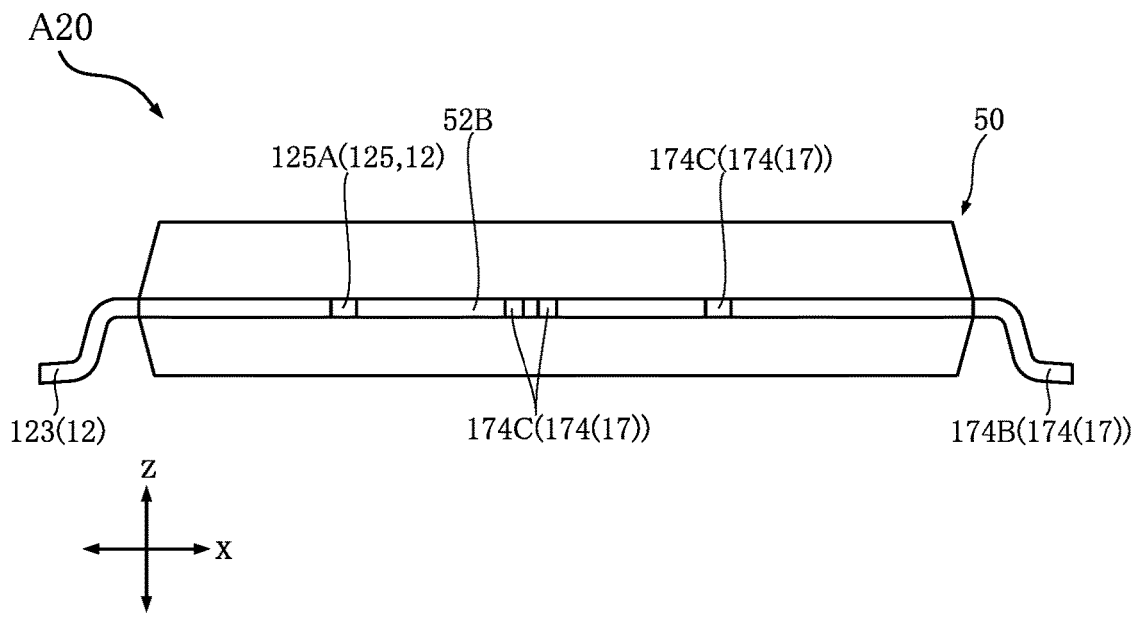
FIG. 18 is a front view of the semiconductor device shown in FIG. 17.

The second output terminal section 174B protrudes to the right from the sealing resin 50 in the first direction x, when viewed in the thickness direction z. The second output terminal section 174B is connected to the pad section 174A. As shown in FIG. 18, the second output terminal section 174B is bent, when viewed in the second direction y. The second output terminal section 174B may be covered, for example, with a tin-plated layer or a tin-silver alloy-plated layer.

The plurality of boot leads 15 are located on the right of the second lead 12 in the first direction x, as shown in FIG. 17. The plurality of boot leads 15 include a first boot lead 15A and a second boot lead 15B.

As shown in FIG. 17, the first boot lead 15A includes a first boot connecting section 151A and a first boot terminal section 152A.

The first boot connecting section 151A is located between the pad section 171A of the first arm lead 171 and the pad section 173A of the third arm lead 173. The first boot connecting section 151A extends in the first direction x. The surface of the first boot connecting section 151A may be covered, for example, with a silver-plated layer.

The first boot terminal section 152A protrudes to the right from the sealing resin 50 in the first direction x, when viewed in the thickness direction z. The first boot terminal section 152A is bent like the first power supply terminal section 171B shown in FIG. 19, when viewed in the second direction y. The first boot terminal section 152A is located adjacent to the first output terminal section 173B, in the second direction y. The first boot terminal section 152A may be covered, for example, with a tin-plated layer or a tin-silver alloy-plated layer.

As shown in FIG. 17, the second boot lead 15B includes a second boot connecting section 151B and a second boot terminal section 152B.

The second boot connecting section 151B is located between the pad section 172A of the second arm lead 172 and the pad section 174A of the fourth arm lead 174. The second boot connecting section 151B includes a portion extending in the first direction x, and a portion extending therefrom in the second direction y. Accordingly, the second boot connecting section 151B has an L-shape when viewed in the thickness direction z. The surface of the second boot connecting section 151B may be covered, for example, with a silver-plated layer.

The second boot terminal section 152B protrudes to the right from the sealing resin 50 in the first direction x, when viewed in the thickness direction z. The second boot terminal section 152B is bent like the second output terminal section 174B shown in FIG. 18, when viewed in the second direction y. The second boot terminal section 152B is located adjacent to the second output terminal section 174B, in the second direction y. The second boot terminal section 152B may be covered, for example, with a tin-plated layer or a tin-silver alloy-plated layer.

The IC 20 is mounted on the mounting base 111, as shown in FIG. 17. As shown in FIG. 20 and FIG. 21, the IC 20 is bonded to the main face 111A of the mounting base 111, by means of the bonding layer 29. In the semiconductor device A20, the IC 20 outputs a gate voltage for driving the plurality of first switching elements 31 and the plurality of second switching elements 32. Some of the plurality of electrodes 20A of the IC 20 are electrically connected respectively to the plurality of first switching elements 31 and the plurality of second switching elements 32. The remaining electrodes 20A are electrically connected respectively to first lead 11, the plurality of boot leads 15, and the control lead 16.

The control IC 28 is mounted on the mounting base 111 as shown in FIG. 17, and located on the left of the IC 20 in the first direction x. The control IC 28 controls the IC 20. On the surface of the control IC 28, a plurality of electrodes 28A are provided. Some of the plurality of electrodes 28A are electrically connected respectively to some of the plurality of electrodes 20A of the IC 20. The remaining electrodes 28A are electrically connected respectively to the first lead 11, the second lead 12, and the plurality of control leads 16. The plurality of electrodes 28A may be formed of, for example, aluminum.

The plurality of first switching elements 31 include, as shown in FIG. 17, a first element 310A and a second element 310B. The plurality of first switching elements 31 have the same configuration as those of the semiconductor device A10.

As shown in FIG. 17 and FIG. 22, the first element 310A is conductively bonded to the pad section 171A of the first arm lead 171, by means of the conductive bonding layer 39. Accordingly, the first back face electrode 312 of the first element 310A is electrically connected to the first arm lead 171.

As shown in FIG. 17 and FIG. 22, the second element 310B is conductively bonded to the pad section 172A of the second arm lead 172, by means of the conductive bonding layer 39. Accordingly, the first back face electrode 312 of the second element 310B is electrically connected to the second arm lead 172.

The plurality of second switching elements 32 include, as shown in FIG. 17, a third element 320A and a fourth element 320B. The plurality of second switching elements 32 have the same configuration as those of the semiconductor device A10.

As shown in FIG. 17, FIG. 20, and FIG. 22, the third element 320A is conductively bonded to the pad section 173A of the third arm lead 173, by means of the conductive bonding layer 39. Accordingly, the first back face electrode 312 of the third element 320A is electrically connected to the third arm lead 173.

As shown in FIG. 17 and FIG. 21, the fourth element 320B is conductively bonded to the pad section 174A of the fourth arm lead 174, by means of the conductive bonding layer 39. Accordingly, the first back face electrode 312 of the fourth element 320B is electrically connected to the fourth arm lead 174.

The plurality of first wires 41 include two wires, in the example shown in FIG. 17. One of the first wires 41 is connected between the first main face electrode 311 of the first element 310A and the pad section 173A of the third arm lead 173, and therefore the first element 310A and the third arm lead 173 are electrically connected to each other. The other first wire 41 is connected between the first main face electrode 311 of the second element 310B and the pad section 174A of the fourth arm lead 174, and therefore the second element 310B and the fourth arm lead 174 are electrically connected to each other.

The plurality of second wires 42 include two wires, in the example shown in FIG. 17. One of the second wires 42 is connected between the second main face electrode 321 of the third element 320A and the first belt-like section 121, and therefore the third element 320A and the second lead 12 are electrically connected to each other. The other second wire 42 is connected between the second main face electrode 321 of the fourth element 320B and the second belt-like section 122, and therefore the fourth element 320B and the second lead 12 are electrically connected to each other.

The plurality of first potential wires 441 are, as shown in FIG. 17, respectively connected to the plurality of electrodes 20A of the IC 20, and the first main face electrode 311 of the plurality of first switching elements 31. By means of the plurality of first potential wires 441, the first main face electrode 311 of the first element 310A, and the first main face electrode 311 of the second element 310B are electrically connected to the IC 20. In the semiconductor device A20 also, as in the semiconductor device A10, the gate power supply that generates the gate voltage for driving the first element 310A and the second element 310B includes the plurality of capacitors C (see FIG. 23) electrically connected to the semiconductor device A20. The plurality of capacitors C are respectively associated with the first element 310A and the second element 310B. The negative potential of each of the capacitors C is transmitted to the IC 20, via the corresponding first potential wire 441.

The second potential wire 442 is, as shown in FIG. 17, connected between the electrode 28A of the control IC 28 and the second lead 12. The second main face electrode 321 of the third element 320A, and the second main face electrode 321 of the fourth element 320B are electrically connected to the control IC 28, via the plurality of second wires 42, the second lead 12, and the second potential wire 442. The second potential wire 442 transmits the potential at the second main face electrode 321 of the third element 320A, and the second main face electrode 321 of the fourth element 320B, to the control IC 28.

The plurality of boot wires 45 are, as shown in FIG. 17, respectively connected to the plurality of electrodes 20A of the IC 20, the first boot connecting section 151A, and the second boot connecting section 151B. The first boot lead 15A and the second boot lead 15B are electrically connected to the IC 20, via the plurality of boot wires 45.

The plurality of ground wires 46 include two wires, in the example shown in FIG. 17. One of the ground wires 46 is connected between the electrode 20A of the IC 20 and the mounting base 111. The other ground wire 46 is connected between the electrode 28A of the control IC 28 and the first joint section 113. Accordingly, the first lead 11 is electrically connected to both of the IC 20 and the control IC 28.

As shown in FIG. 17, the plurality of control wires 47 can be classified into three groups, according to the connection target. One of the control wires 47 of a first group connects between one of the electrodes 28A of the control IC 28, and a corresponding control connection section 161. One of the control wires 47 of a second group connects between one of the electrodes 28A of the control IC 28, and a corresponding electrode 20A of the IC 20. One of the control wires 47 of a third group connects between one of the electrodes 20A of the IC 20, and a corresponding control connection section 161.

As is apparent from FIG. 17, the sealing resin 50 is arranged to cover a part of each of the first lead 11, the second lead 12, the plurality of arm leads 17, the plurality of boot leads 15, and the plurality of control leads 16. The sealing resin 50 is arranged also to cover the IC 20, the control IC 28, the plurality of first switching elements 31, and the plurality of second switching elements 32 (see also FIG. 20 to FIG. 22).

As shown in FIG. 19, the respective end faces 114A of the pair of first suspension sections 114, and the end face 121B of the first belt-like section 121 are exposed from the second side face 52A. As shown in FIG. 18, the end face 125A of the second suspension section 125, and the plurality of end faces 174C of the pad section 174A (fourth arm lead 174) oriented in the second direction y, are exposed from the second side face 52B.

Figure 23:
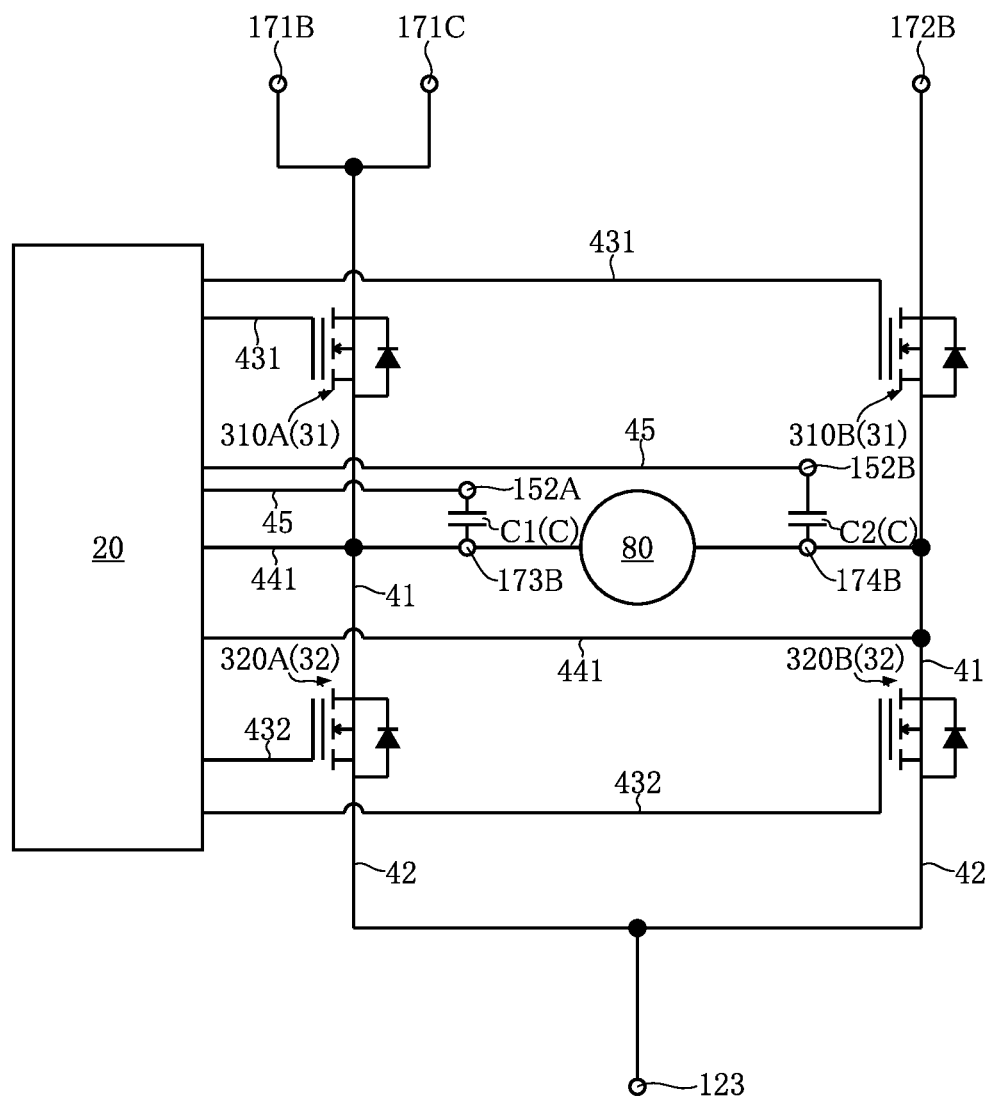
FIG. 23 is a circuit diagram for explaining the semiconductor device shown in FIG. 17.

Referring to FIG. 23, the control of the motor 80, performed by the semiconductor device A20, will be described hereunder.

As shown in FIG. 23, the motor 80, which is the target of the control, is connected to the first output terminal section 173B and the second output terminal section 174B of the semiconductor device A20. The motor 80 is a DC motor.

In the semiconductor device A20, a DC power for driving the motor 80 is inputted to the first power supply terminal section 171B, the second power supply terminal section 171C, and the third power supply terminal section 172B. The current of the DC power inputted to the first power supply terminal section 171B, the second power supply terminal section 171C, and the third power supply terminal section 172B sequentially flows through the plurality of first switching elements 31, the plurality of first wires 41, the plurality of second switching elements 32, and the plurality of second wires 42, and is outputted from the second terminal section 123.

The plurality of capacitors C include a first capacitor C1 and a second capacitor C2. The first capacitor C1 is electrically connected to both of the first boot terminal section 152A and the first output terminal section 173B. The first capacitor C1 acts as the gate power supply that generates the gate voltage for driving the first element 310A. The second capacitor C2 is electrically connected to both of the second boot terminal section 152B and the second output terminal section 174B. The second capacitor C2 acts as the gate power supply that generates the gate voltage for driving the second element 310B.

When the first element 310A and the fourth element 320B are turned on, and the second element 310B and the third element 320A are turned off, with the gate voltage outputted from the IC 20, the current runs from the first output terminal section 173B toward the second output terminal section 174B. Accordingly, the motor 80 is caused to rotate (forward rotation). At this point, the positive potential of the power supply for driving the IC 20 is applied to the second boot terminal section 152B via the boot wire 45, so that the second capacitor C2 is charged.

When the second element 310B and the third element 320A are turned on, and the first element 310A and the fourth element 320B are turned off, with the gate voltage outputted from the IC 20, the current runs from the second output terminal section 174B toward the first output terminal section 173B. Accordingly, the motor 80 is caused to rotate in the opposite direction (reverse rotation) to the rotation realized when the first element 310A and the fourth element 320B were on. At this point, the positive potential of the power supply for driving the IC 20 is applied to the first boot terminal section 152A via the boot wire 45, so that the first capacitor C1 is charged.

When the first element 310A and the second element 310B are turned off, and the third element 320A and the fourth element 320B are turned on, with the gate voltage outputted from the IC 20, while the motor 80 is rotating, a counter-electromotive force is generated between the first output terminal section 173B and the second output terminal section 174B. This force acts as a brake against the rotation of the motor 80, and therefore the motor 80 can be stopped in a shorter time.

When the first element 310A, the second element 310B, the third element 320A, and the fourth element 320B are all off, the motor 80 does not rotate.

The semiconductor device A20 provides the following advantageous effects.

The semiconductor device A20 includes the first lead 11 having the mounting base 111, and the second lead 12 including the first belt-like section 121 and the second belt-like section 122. In FIG. 17, the first belt-like section 121 is located on the right of the mounting base 111 in the first direction x, and extends in the first direction x. The second belt-like section 122 extends to the left in the first direction x, from the end of the first belt-like section 121 in the second direction y. The mounting base 111 overlaps with the first belt-like section 121, when viewed in the first direction x. At least a part of the mounting base 111 is located adjacent to the second belt-like section 122, in the second direction y. Accordingly, one of the plurality of arm leads 17 can be located adjacent to the second belt-like section 122, in the second direction y. The mentioned configuration enables reduction in outer size of the semiconductor device A20 in the second direction y, while keeping the outer size of the semiconductor device A20 in the first direction x at a predetermined value. In other words, the semiconductor device can be formed in a reduced size.

The present disclosure is not limited to the foregoing embodiments. The specific configuration of the elements of the semiconductor device according to the present disclosure may be modified in various manners.

The present disclosure includes configurations according to the following appendix.

Appendix 1. A semiconductor device comprising:
a first lead having a mounting base;
an IC configured to be mounted on the mounting base;
a second lead including a first belt-like section spaced apart from the mounting base in a first direction, and a second belt-like section connected to the first belt-like section, the first belt-like section being elongate in a second direction orthogonal to both of the first direction and a thickness direction of the mounting base, and the second belt-like section extending in the first direction, from an end of the first belt-like section toward a part of the first lead;
a plurality of arm leads arranged to locate opposite to the first lead in the first direction with respect to the second lead;
a plurality of switching elements configured to electrically connect to the arm leads, respectively, each switching element being electrically connected to the IC; and
a sealing resin arranged to cover a part of each of the arm leads, the first lead and the second lead and further arranged to cover the IC and the plurality of switching elements,
wherein the mounting base overlaps with the first belt-like section when viewed in the first direction, and at least a part of the mounting base is located adjacent to the second belt-like section in the second direction.

The invention claimed is:
1. A semiconductor device comprising:
a first lead including a mounting base elongate in a first direction;
an IC configured to be mounted on the mounting base;
a second lead including a first belt-like section spaced apart from the mounting base in the first direction, and a pair of second belt-like sections connected to the first belt-like section, the first belt-like section being elongate in a second direction orthogonal to both of the first direction and a thickness direction of the mounting base;
a third lead configured to space apart from the first lead, with the second lead interposed therebetween;

a plurality of first switching elements configured to electrically connect to the third lead, and configured to electrically connect to the IC;
a plurality of fourth leads configured to space apart from the second lead, with the third lead interposed therebetween, and configured to electrically connect respectively to the plurality of first switching elements;
a plurality of second switching elements configured to electrically connect respectively to the plurality of fourth leads, and each configured to electrically connect to both of the IC and the second lead; and
a sealing resin arranged to cover a part of each of the fourth leads, the first lead, the second lead and the third lead, and to cover the IC, the plurality of first switching elements and the plurality of second switching elements,
wherein the mounting base overlaps with the first belt-like section when viewed in the first direction, and
at least a part of the mounting base is located between the pair of second belt-like sections.

2. The semiconductor device according to claim 1, wherein the first lead includes a first terminal section, a first joint section, and a first suspension section, the first terminal section protrudes from the sealing resin in the first direction when viewed in the thickness direction, the first joint section connects the mounting base and the first terminal section to each other, and the first suspension section is located opposite to the first joint section in the second direction with respect to the mounting base, the first suspension section extending from the mounting base in the second direction.

3. The semiconductor device according to claim 2, wherein the first joint section and the first suspension section are located on a farther side from the first belt-like section of the second lead with respect to the pair of second belt-like sections.

4. The semiconductor device according to claim 3, wherein the first joint section includes a region inclined with respect to both of the first direction and the second direction.

5. The semiconductor device according to claim 3, wherein the second lead includes a second terminal section protruding from the sealing resin in the first direction when viewed in the thickness direction, a second joint section connected to one of the pair of second belt-like sections and the second terminal section, and a second suspension section extending from the other of the pair of second belt-like sections in the second direction.

6. The semiconductor device according to claim 5, wherein the second joint section is located adjacent to the first joint section in the second direction, and
the second suspension section is located adjacent to the first suspension section in the first direction.

7. The semiconductor device according to claim 6, wherein the second terminal section is located adjacent to the first terminal section in the second direction.

8. The semiconductor device according to claim 7, wherein the second joint section includes a region inclined with respect to both of the first direction and the second direction.

9. The semiconductor device according to claim 7, wherein the third lead includes a plurality of first pad sections to which the plurality of first switching elements are electrically connected respectively, a third terminal section protruding from the sealing resin in the first direction when viewed in the thickness direction, and a third joint section connected to the plurality of first pad sections and the third terminal section.

10. The semiconductor device according to claim 9, wherein the plurality of first pad section include a first region located adjacent to the second suspension section in the first direction, a second region located adjacent to the first belt-like section in the first direction, and a third region located adjacent to the second joint section in the first direction,
the third joint section includes an outer joint section connected to the first region and the third terminal section, a first inner joint section connected to the first region and the second region, and a second inner joint section connected to the second region and the third region, and
the first belt-like section overlaps with the second region, the first inner joint section, and the second inner joint section, when viewed in the first direction, and a part of each of the pair of second belt-like sections is located between the first inner joint section and the second inner joint section.

11. The semiconductor device according to claim 10, wherein the third lead includes a third suspension section extending from the third region in the second direction.

12. The semiconductor device according to claim 11, wherein a part of the second region protrudes from both of the first inner joint section and the second inner joint section in the first direction.

13. The semiconductor device according to claim 12, wherein the first inner joint section and the second inner joint section each include a belt-like region extending from the second region in the second direction, and
the belt-like region of the first inner joint section is shorter than the belt-like region of the second inner joint section.

14. The semiconductor device according to claim 12, wherein the plurality of fourth leads each include a second pad section to which one of the plurality of second switching elements is electrically connected, and a fourth terminal section connected to the second pad section and protruding from the sealing resin in the first direction when viewed in the thickness direction, and
the plurality of fourth terminal sections are aligned in the second direction together with the third terminal section.

15. The semiconductor device according to claim 14, wherein a part of one of the plurality of second pad sections overlaps with the first region, and is located between the outer joint section and the first inner joint section when viewed in the first direction.

16. The semiconductor device according to claim 15, wherein the sealing resin includes a pair of side faces spaced apart from each other in the second direction,
the first suspension section and the second suspension section each have an end face exposed from one of the pair of side faces, and
the third suspension section has an end face exposed from the other of the pair of side faces.

17. The semiconductor device according to claim 1, wherein the IC has a belt-like shape elongate in the first direction when viewed in the thickness direction.

* * * * *